United States Patent [19]

Iyer et al.

[11] Patent Number: 5,442,350
[45] Date of Patent: Aug. 15, 1995

[54] METHOD AND MEANS PROVIDING STATIC DICTIONARY STRUCTURES FOR COMPRESSING CHARACTER DATA AND EXPANDING COMPRESSED DATA

[75] Inventors: Balakrishna R. Iyer, San Jose, Calif.; Clark Kurtz, Highland; Kenneth E. Plambeck, Poughkeepsie, both of N.Y.; Bhaskar Sinha, Boxford, Mass.

[73] Assignee: International Business Machines Corporation, Armonk, N.Y.

[21] Appl. No.: 968,631

[22] Filed: Oct. 29, 1992

[51] Int. Cl.$^6$ .............................................. H03M 7/30
[52] U.S. Cl. ........................................ 341/51; 341/106
[58] Field of Search ............................ 341/51, 95, 106

[56] References Cited

U.S. PATENT DOCUMENTS

| | | | |
|---|---|---|---|
| 4,814,746 | 3/1989 | Miller et al. | 341/95 |
| 5,325,091 | 6/1994 | Kaplan et al. | 341/51 |

Primary Examiner—Howard L. Williams
Attorney, Agent, or Firm—Bernard M. Goldman

[57] ABSTRACT

Ziv-Lempel-type compression and expansion using separate static compression and expansion dictionaries as opposed to a single adaptive dictionary. The static dictionaries make random access processes usable for short data records instead of only long sequential data streams. Degree of compression and compression performance are improved by allowance of multiple extension characters per node and multiple children, of the same parent, that have the same first extension character. Performance is further improved by searching for matches on children of a parent and detecting a last possible match by means of fields in the parent instead of by accessing the children. Expansion performance is improved by representing in an entry not only the extension character or characters of the entry but also those of some number of ancestors of the entry, thus avoiding accessing the ancestors.

98 Claims, 19 Drawing Sheets

FIG. 7

| LOC | EC | CPTR | PPTR |
|-----|----|----|----|
| 0 | A | 3 | |
| 1 | B | | |
| 2 | C | | |
| 3 | A | | 0 |
| 4 | B | 5 | 0 |
| 5 | A | | 4 |
| 6 | B | | 4 |
| 7 | C | 8 | 4 |
| 8 | A | | 7 |
| 9 | B | | 7 |

FIG. 8

| LOC | EC FIELD | CPTR | PPTR | CHARACTER SYMBOL |
|-----|----------|------|------|------------------|
| 0 | A | 3 | | A |
| 1 | B | | | B |
| 2 | C | | | C |
| 3 | AA | | | AA |
| 4 | AB | 5 | | AB |
| 5 | ABA | | | ABA |
| 6 | ABB | | | ABB |
| 7 | ABC | 8 | | ABC |
| 8 | A | | 7 | ABCA |
| 9 | B | | 7 | ABCB |

FIG. 9

| LOC | EC FIELD | CPTR | PPTR | CC FIELD |
|-----|----------|------|------|----------|
| 0 | A | 3 | | AB |
| 1 | B | | | |
| 2 | C | | | |
| 3 | AA | | | |
| 4 | AB | 5 | | ABC |
| 5 | ABA | | | |
| 6 | ABB | | | |
| 7 | ABC | 8 | | AB |
| 8 | A | | 7 | |
| 9 | B | | 7 | |

FIG. 10

| LOC | EC FIELD | CPTR | PPTR | CC FIELD | SC FIELD |
|-----|----------|------|------|----------|----------|
| 0 | A | 3 | | ABC | |
| 1 | B | | | | |
| 2 | C | | | | |
| 3 | AA | | | | |
| 4 | AB | | | | |
| 5 | AC | | | | |
| 6 | AD | | | | EFG |
| 7 | AE | | | | |
| 8 | AF | | | | |
| 9 | AG | | | | |
| 10 | AH | | | | I |
| 11 | AI | | | | |

C - ENTRY HAS CHILDREN
M - ENTRY HAS MORE CHILDREN
U - UNUSED

FIG. 11B

```
-----------------------------------
| C | M | S |    SYMBOL LENGTH    |
-----------------------------------
  0   1   2   3   4   5   6   7
```

C - ENTRY HAS CHILDREN
M - ENTRY HAS MORE CHILDREN
S - ENTRY HAS MORE SIBLINGS

FIG. 11C

```
-------------------------------------
|  CD  |      CPTR      |   CC   |
-------------------------------------
  0     4                16       24
```

FIG. 11D

```
-----------------------------------------
|   CB   |   CPTR   |/////|   EC   |
-----------------------------------------
  0        8         20    24       32
```

FIG. 11E

```
-----------------------------------------
|   CB   |   PPTR   |/////|   EC   |
-----------------------------------------
  0        8         20    24       32
```

FIG. 11F

```
-------------------------------------------
|   CB   |   CPTR   |   PPTR   |   EC   |
-------------------------------------------
  0        8          20         32       40
```

FIG. 13

```
                                                        CHARACTER
LOC  FMT  DICTIONARY ENTRY                              SYMBOL
          ----------------------------------------------
 0   F3A  | CD    | CPTR   | C1 | C2 | C3 | C4 | C5 | C6 |
          |-------|--------|----|----|----|----|----|----|
          | C,    |   1    | B  | B  |    |    |    |    |  A

1   F3   |   CB     | CPTR   |/| E1 | E2 | C1 | C2 | C3 |
          |----------|--------|-|----|----|----|----|----|
          |C, , ,2   |   2    |/| A  | B  | C  | C  |    |  AB

2   F3   |   CB     | CPTR   |/| E1 | E2 | E3 | E4 | C1 |
          |----------|--------|-|----|----|----|----|----|
          |C, , ,4   |   3    |/| A  | B  | C  | D  | E  |  ABCD

3   F3   |   CB     | CPTR   |/| E1 | E2 | E3 | E4 | E5 |
          |----------|--------|-|----|----|----|----|----|
          |C,M, ,5   |   4    |/| A  | B  | C  | D  | E  |  ABCDE

4   F4   |   CB     | CPTR   | PPTR   | E1 | C1 | C2 | C3 |
          |----------|--------|--------|----|----|----|----|
          |C, ,S,6   |   6    |   3    | F  | G  | X  | X  |  ABCDEF

5   F1   |   CB     | E2 | E2 | E3 | E4 | E5 | E6 | E7 |
          |----------|----|----|----|----|----|----|----|
          | , , ,7   | A  | B  | C  | D  | E  | X  | Y  |  ABCDEXY

6   F4   |   CB     | CPTR   | PPTR   | E1 | E2 | C1 | C2 |
          |----------|--------|--------|----|----|----|----|
          |C, , ,7   |   8    |   3    | F  | G  | H  | H  |  ABCDEFG

7   F1   |   CB     | E2 | E2 | E3 | E4 | E5 | E6 | E7 |
          |----------|----|----|----|----|----|----|----|
          | , , ,7   | A  | B  | C  | D  | E  | F  | X  |  ABCDEFX

8   F2   |   CB     | PPTR   |/| E1 | E2 | E3 | E4 | E5 |
          |----------|--------|-|----|----|----|----|----|
          | , , ,8   |   3    |/| F  | G  | H  |    |    |  ABCDEFGH

8   F1   |   CB     | E2 | E2 | E3 | E4 | E5 | E6 | E7 |
          |----------|----|----|----|----|----|----|----|
          | , , ,7   | A  | B  | C  | D  | E  | X  | Y  |  ABCDEFGH
```

FIG. 15A

```
                            AVAILABLE
           |<- ECS ->|<- CC SPACES->|
-------------------------------------------------
| F3 CB | CPTR  |//| E1 | E2 | C1 | C2 | C3 |
|-------|-------|//|----|----|----|----|----|
|C,M, ,2|       |//| A  | B  | A  | B  | C  |
-----------V----------------M----M----M--- NO MATCH
CHILD      |    INCREMENT--> +0   +1   +2   +3
MORE       |                  |    |    |    |
SL=2       |                  |    |    |    |
  | |      |----------------------------------
  (ADD)                VNS=VALUE NOT SHOWN
  |        -------------------------------------------
  |-->  +0 | F3 CB | CPTR  |//| E1 | E2 | E3 | C1 | C2 |
  |        |-------|-------|//|----|----|----|----|----|
  |        |C,M, ,3| VNS   |//| A  | B  | A  | X  | Y  |
  |        ===========================================
  |-->  +1 | F1 CB | E1 | E2 | E3 | E4 | E5 | E6 | E7 |
  |        |-------|----|----|----|----|----|----|----|
  |        | , , ,3| A  | B  | B  |    |    |    |    |
  |        ===========================================
  |-->  +2 | F3 CB | CPTR  |//| E1 | E2 | E3 | C1 | C2 |
  |        |-------|-------|//|----|----|----|----|----|
  |        |C, , ,3| VNS   |//| A  | B  | C  | X  | X  |
  |        ===========================================
  |-->  +3 | F1 CB | E1 | E2 | E3 | S1 | S2 | S3 | S4 |
  |        |-------|----|----|----|----|----|----|----|
  | |      | , ,S,3| A  | B  | D  | E  | E  |    |    |
  (ADD)    ===========================================
  |-->  +4 | F3 CB | CPTR  |//| E1 | E2 | E3 | C1 | C2 |
           |-------|-------|//|----|----|----|----|----|
           |C,M, ,3| VNS   |//| A  | B  | E  | X  | Y  |
           -------------------------------------------
```

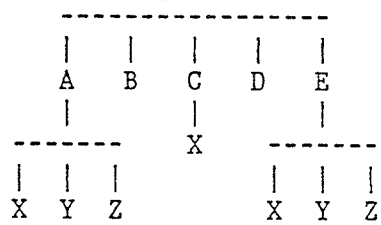

```
---------------------------------------------------
| CB   | CPTR |//| E1 | E2 | E3 | C1 | C2 |
|------|------|//|----|----|----|----|----|
|C,M, ,3|     |//| A  | B  | C  | A  | B  |
---------V-----------------------M----M--- NO MATCH
         |                       +0   +1   +2
         |                       |    |    |
         | |---------------------------------------
         | |
        (ADD)
         |
         |--> +0 | CB    | E1 | E2 | E3 | E4 | E5 | E6 | E7 |
         |      |-------|----|----|----|----|----|----|----|
         |      | , , ,4| A  | B  | C  | A  |    |    |    |
         |
         |--> +1 | CB    | E1 | E2 | E3 | E4 | E5 | E6 | E7 |
         |      |-------|----|----|----|----|----|----|----|
         |      | , , ,4| A  | B  | C  | B  |    |    |    |
         |
         |--> +2 | CB    | S1 | S2 | S3 | S4 | S5 | S6 | S7 |
         |      |-------|----|----|----|----|----|----|----|
         | |    | *SD*  | C  | D  | E  | F  | F  |    |    |
        (ADD)
         |--> +3 | CB    | E1 | E2 | E3 | E4 | E5 | E6 | E7 |
         |      |-------|----|----|----|----|----|----|----|
         |      | , , ,4| A  | B  | C  | C  |    |    |    |
         |
         |--> +4 | CB    | E1 | E2 | E3 | E4 | E5 | E6 | E7 |
         |      |-------|----|----|----|----|----|----|----|
         |      | , , ,4| A  | B  | C  | D  |    |    |    |
         |
         |--> +5 | CB    | E1 | E2 | E3 | E4 | E5 | E6 | E7 |
         |      |-------|----|----|----|----|----|----|----|
         |      | , , ,4| A  | B  | C  | E  |    |    |    |
         |
         |--> +6 | CB    | E1 | E2 | E3 | E4 | E5 | E6 | E7 |
                |-------|----|----|----|----|----|----|----|
                | , , ,4| A  | B  | C  | F  |    |    |    |
```

```
COMPRESSION CALL (CMPSC)
-----------------------------------------
| Op Code    |////////| R1 | R2 |
-----------------------------------------
0               16       24   28  31
```

CONDITION CODES:

CC0  END OF SOURCE OPERAND REACHED

CC1  END OF DESTINATION OPERAND REACHED, AND END OF SOURCE OPERAND NOT REACHED

FIG. 17B

```
R1
-----------------------------------------
| |    DESTINATION OPERAND ADDRESS    |
-----------------------------------------
0 1                                    31

R1+1
-----------------------------------------
|      DESTINATION OPERAND LENGTH      |
-----------------------------------------
0                                      31

R2
-----------------------------------------
| |      SOURCE OPERAND ADDRESS        |
-----------------------------------------
0 1                                    31

R2+1
-----------------------------------------
|        SOURCE OPERAND LENGTH         |
-----------------------------------------
0                                      31

GR1
-----------------------------------------
| |DICTIONARY ADDRESS*|////|ISS|E|/|CBN|
-----------------------------------------
0 1                  20   24 27 29  31
```

ISS: INDEX SYMBOL SIZE

| ISS (BIN) | INDEX SYMBOL SIZE | DICTIONARY SIZE |
|-----------|-------------------|-----------------|
| 001       | 9 BITS            | 512 ENTRIES     |
| 010       | 10 BITS           | 1K ENTRIES      |
| 011       | 11 BITS           | 2K ENTRIES      |
| 100       | 12 BITS           | 4K ENTRIES      |
| 101       | 13 BITS           | 8K ENTRIES      |

E=0: COMPRESSION OPERATION
E=1: EXPANSION OPERATION

CBN: COMPRESSED DATA BIT NUMBER

\* DICTIONARY SPECIFIED IN GR1 IS A COMPRESSION DICTIONARY DURING COMPRESSION OR AN EXPANSION DICTIONARY DURING EXPANSION.

NOTATION:                                                    FIG. 18
  ACT    AEC COUNT; NUMBER OF AECS IN THIS ENTRY.
  [AEC]  ADDITIONAL EXTENSION CHARACTER MAY BE IN THE FIELD.
  ...    PRECEDING FIELD MAY BE REPEATED.
  CC     CHILD CHARACTER; FIRST EC OF A CHILD.
  CCT    CC COUNT; NUMBER OF CCS IN THIS ENTRY.
  CPTR   CHILD POINTER; INDEX OF FIRST CHILD.
  D      DOUBLE-CHARACTER ENTRY; SAME AS ACT=0 OR 1.
  M      MORE-CHILDREN BIT; THIS ENTRY HAS MORE CHILDREN THAN CCS.
  S      MORE-SIBLINGS BIT; THIS ENTRY HAS MORE SIBLINGS THAN SCS.
  SC     SIBLING CHARACTER; FIRST TRUE EC OF A SIBLING.
  SCT    SIBLING CHARACTER COUNT; NUMBER OF SCS IN THIS ENTRY.
  X      EXAMINE-CHILD BIT FOR CC; CHILD HAS AN AEC OR A CHILD.
  Y      EXAMINE-CHILD BIT FOR SC; CHILD HAS AN AEC OR A CHILD.

FORMAT C0 CHARACTER ENTRY (CCT=0)
----------------------------------------------------------------
|CCT|    |ACT|       | [AEC] |  ...  |  ...  |  ...  |         |
----------------------------------------------------------------
0    3   8   11      24      32      40      48      56       63

CCT=0 INDICATES FORMAT C0 ENTRY, WHICH HAS NO CC.
  ACT=0 TO 4; FROM 0 TO 4 AECS MAY BE IN THIS ENTRY.

FORMAT C1 CHARACTER ENTRY (CCT=1)
----------------------------------------------------------------
|CCT|X|  |ACT|  CPTR  | [AEC] |  ...  |   CC   |              |
----------------------------------------------------------------
0    3   8   11       24              N                      63

CCT=1 INDICATES FORMAT C1 ENTRY, WHICH HAS ONE CC.
  ACT=0 TO 4; FROM 0 TO 4 AECS MAY BE IN THIS ENTRY.
  N=24 + (ACT*8).

FORMAT CG1 CHARACTER ENTRY (CCT>1)
----------------------------------------------------------------
|CCT|XXXXX| MD|  CPTR  | [AEC] |  CC  |  CC  |  ...  |  ...  |
----------------------------------------------------------------
0    3    8  11        24      N      N+8                   63

CCT>1 INDICATES CG1. CCT=2 TO 5 IF D=0, OR CCT=2 TO 4 IF D=1.
  D=0 OR 1; EITHER 0 OR 1 AECS MAY BE IN THIS ENTRY.
  N=24 + (D*8).
  XXXXX ARE ASSOCIATED RESPECTIVELY WITH CCS IN THIS ENTRY.

SIBLING DESCRIPTOR ENTRY
----------------------------------------------------------------
|SCT|YYYYY|YS|  |   SC   |  ...  |  ...  |  ...  |  ...  |  ...  |
----------------------------------------------------------------
0    3    8 10 16        24      32      40      48      56    63

SCT=1 TO 6.
  YYYYY ARE ASSOCIATED RESPECTIVELY WITH SCS IN THIS ENTRY.

FIG. 19A

```
         START            NOTES: FIELDS ARE IN PARENT UNLESS
(1)--->|                         OTHERWISE SPECIFIED.  CH=CHILD,
       V                         SRC=SOURCE, DST=DESTINATION.
   ANOTHER SRC
   CHAR EXISTS?   NO-------->SET CC0 AND ENDOP.
       YES
(2)--->|                (8)-->STORE PARENT INDEX IN DST.
       V                      ADVANCE 1 INDEX IN DST. -->(2)
   ANOTHER DST INDEX
   POSITION EXISTS?  NO---->SET CC1 AND ENDOP.
       YES
       |
       V  41
   USE NEXT SRC CHAR AS
   INDEX OF ALPHABET ENTRY.
   CALL THIS ENTRY PARENT.
   ADVANCE 1 BYTE IN SRC.
(3)--->|
       V
     CCT=0?   YES----->(9)-->STORE PARENT INDEX IN DST.
       NO                    ADVANCE 1 INDEX IN DST. -->(1)
(4)--->|
       V
   ANOTHER SRC                   42
   CHAR EXISTS?   NO-------->STORE PARENT INDEX IN DST.
       YES                   ADVANCE 1 INDEX IN DST.
       |                     SET CC0 AND ENDOP.
       V  43
   REPEAT FOR EACH CC.
   ------>|
|      V                          44
|  NEXT SRC CHAR=CC?   YES-->SET CHILD INDEX=
|      NO                    CPTR+CC NUMBER
| (5)->|                     (0 ORIGIN NUMBERING).
|      V                         |
|  ANOTHER CC?                V  45              46
---YES  NO              X=1 FOR CHILD?  NO-->STORE CH INDEX IN DST.
       |                    YES              ADVANCE 1 INDEX IN DST.
       V  53                 |               ADVANCE 1 BYTE IN SRC.
     M=1?   NO-->(8)         |                        |
       YES                V  47                       |
       |              ACT=0 OR D=0         48       --->(1)
       V               IN CHILD?   YES-->CALL CHILD THE PARENT.
      (6)                 NO              ADVANCE 1 BYTE IN SRC.
    GO TO FIG. 19B          |                        |
                         V  49                     --->(4)
                     COMPARE SRC CHARS AFTER
                     NEXT CHAR TO AECS IN CHILD
                            |
                            V
                        (10) GO TO FIG. 19B
```

FIG. 20

NOTATION:

CSL    COMPLETE SYMBOL LENGTH; NUMBER OF ECS IN UNPRECEDED ENTRY.
  EC     EXTENSION CHARACTER.
  ...    PRECEDING FIELD MAY BE REPEATED.
  OFST   OFFSET TO WHERE FIRST EC IN THIS ENTRY IS TO BE PLACED.
  PPTR   PREDECESSOR POINTER; INDEX OF ENTRY CONTAINING PRECEDING
        ECS.
  PSL    PARTIAL SYMBOL LENGTH; NUMBER OF ECS IN PRECEDED ENTRY.

UNPRECEDED CHARACTER ENTRY (PSL=0)
```
-----------------------------------------------------------------
|PSL||CSL|  EC   |  ...  |  ...  |  ...  |  ...  |  ...  |  ...  |
-----------------------------------------------------------------
0   2   5      16      24      32      40      48      52      63
```

PSL=0 INDICATES UNPRECEDED ENTRY.
  CSL=1 TO 7.

PRECEDED CHARACTER ENTRY (PSL>0)
```
-----------------------------------------------------------------
|PSL|  PPTR   |  EC   |  ...  |  ...  |  ...  |  ...  | OFST    |
-----------------------------------------------------------------
0    3         16      24      32      40      48      52      63
```

PSL>0 INDICATES PRECEDED ENTRY; PSL=1 TO 5.
  OFST=0 TO 255.

FIG. 21

```
      START                    NOTES: FIELDS ARE IN CURRENT ENTRY.
 (1)--->|                             SRC=SOURCE, DST=DESTINATION.
        V
    ANOTHER SRC
    INDEX EXISTS?  NO-------->SET CC0 AND ENDOP.
        YES
         |
         V  71                      72
    NEXT SRC
    INDEX<256?    YES--------->ANOTHER DST BYTE
        NO                     POSITION EXISTS?   NO---->SET CC1
         |                          YES                  AND ENDOP.
         V  74                       |
    USE NEXT SRC INDEX                V  73
    AS INDEX OF CURRENT         STORE INDEX AS CHAR IN DST.
    ENTRY.                      ADVANCE 1 INDEX IN SRC.
         |                      ADVANCE 1 BYTE IN DST. --->(1)
         V  75                       76
       PSL=0?    YES----------->CSL DST BYTE
        NO                      POSITIONS EXIST?  NO---->SET CC1
         |                          YES                  AND ENDOP.
         V  78                       |
    SET SYMLEN=                      V  77
    PSL+OFST                   GET CSL ECS FROM ENTRY
         |                     AND STORE IN DST.
         |                     ADVANCE 1 INDEX IN SRC.
         V  79                 ADVANCE CSL BYTES IN DST. --->(1)
    SYMLEN DST BYTE
    POSITIONS EXIST?  NO---->SET CC1 AND ENDOP.
        YES
         |
         V  80
    GET PSL ECS FROM ENTRY
    AND STORE IN DST AT OFST.
    USE PPTR AS INDEX OF
    CURRENT ENTRY (SEE NOTE).
 ------>|
 |      V  81                     82
 |    PSL=0?    YES--------->GET CSL ECs FROM ENTRY
 |     NO                    AND STORE IN DST.
 |      |                    ADVANCE 1 INDEX IN SRC.
 |      |                    ADVANCE SYMLEN BYTES IN DST. --->(1)
 |      V  83
 |  GET PSL ECs FROM ENTRY
 |  AND STORE IN DST AT OFST.   NOTE: IF PPTR<256, THE ACTION
 |  USE PPTR AS INDEX OF              CAN BE:
 |  CURRENT ENTRY (SEE NOTE).
 |      |                       STORE PPTR AS CHAR IN DST.
 --------                       ADVANCE 1 INDEX IN SRC.
                                ADVANCE SYMLEN BYTES IN DST.
                                        |
                                     --->(1)
```

FIG. 22

| | COMPRESSION DICTIONARY | | | | | | EXPANSION DICTIONARY | | | | | |
|---|---|---|---|---|---|---|---|---|---|---|---|---|
| IN-DEX | CCT | XXXXX | D OR ACT | CPTR | AECS | CCS | AS | STG REFS | PSL | CSL | PPTR | ECS | OFST |
| 193 | 5 | 11110 | 0 | 256 | | AAAAA | 1 | 1 | 0 | 1 | | A | |
| 256 | 1 | 1 | 4 | 261 | AAAA | A | 6 | 2 | 0 | 6 | | AAAAAA | |
| 257 | 0 | | 3 | | AAA | | 5 | 3 | 0 | 5 | | AAAAA | |
| 258 | 0 | | 2 | | AA | | 4 | 4 | 0 | 4 | | AAAA | |
| 259 | 0 | | 1 | | A | | 3 | 5 | 0 | 3 | | AAA | |
| 260 | 0 | | 0 | | | | 2 | 6 | 0 | 2 | | AA | |
| 261 | 5 | 11110 | 0 | 262 | | AAAAA | 7 | 3 | 0 | 7 | | AAAAAAA | |
| 262 | 1 | 1 | 4 | 267 | AAAA | A | 12 | 4 | 5 | | 261 | AAAAA | 7 |
| 263 | 0 | | 3 | | AAA | | 11 | 5 | 4 | | 261 | AAAA | 7 |
| 264 | 0 | | 2 | | AA | | 10 | 6 | 3 | | 261 | AAA | 7 |
| 265 | 0 | | 1 | | A | | 9 | 7 | 2 | | 261 | AA | 7 |
| 266 | 0 | | 0 | | | | 8 | 8 | 1 | | 261 | A | 7 |
| 267 | 5 | 11110 | 0 | 268 | | AAAAA | 13 | 5 | 1 | | 262 | A | 12 |
| 268 | 1 | 1 | 4 | 273 | AAAA | A | 18 | 6 | 1 | | 269 | A | 17 |
| 269 | 0 | | 3 | | AAA | | 17 | 7 | 5 | | 262 | AAAAA | 12 |
| 270 | 0 | | 2 | | AA | | 16 | 8 | 4 | | 262 | AAAA | 12 |
| 271 | 0 | | 1 | | A | | 15 | 9 | 3 | | 262 | AAA | 12 |
| 272 | 0 | | 0 | | | | 14 | 10 | 2 | | 262 | AA | 12 |
| 273 | 5 | 11110 | 0 | 274 | | AAAAA | 19 | 7 | 2 | | 269 | AA | 17 |
| 274 | 1 | 1 | 4 | 279 | AAAA | A | 24 | 8 | 2 | | 276 | AA | 22 |
| 275 | 0 | | 3 | | AAA | | 23 | 9 | 1 | | 276 | A | 22 |
| 276 | 0 | | 2 | | AA | | 22 | 10 | 5 | | 269 | AAAAA | 17 |
| 277 | 0 | | 1 | | A | | 21 | 11 | 4 | | 269 | AAAA | 17 |
| 278 | 0 | | 0 | | | | 20 | 12 | 3 | | 269 | AAA | 17 |
| 279 | 5 | 11110 | 0 | 280 | | AAAAA | 25 | 9 | 3 | | 276 | AAA | 22 |

```
GR1
-----------------------------------------
| |DICTIONARY ADDRESS*|///|S|ISS|E|/|CBN|      FIG. 23A
-----------------------------------------
0 1                   20   24  27 29 31
```

S=0: NO SHORT SYMBOL OPTION
S=1: SHORT SYMBOL OPTION

FIG. 23B

```
                                <--LONG SYMBOL-->
---------------                 ------------------
|INDEX SYMBOL |                 |0|INDEX SYMBOL  |
---------------                 ------------------
0            11                 0              12
```

```
        ---SHORT SYMBOL HEADER WITH LENGTH FIELD
       |   INDICATING ONE SHORT SYMBOL (ONE CHARACTER)
    <----->
    -----------------
    |1|000|   CHAR  |
    -----------------
    0    4        11
    <-12 BIT SHORT->
      SYMBOL STRING

---SHORT SYMBOL HEADER WITH LENGTH FIELD
       |   INDICATING TWO SHORT SYMBOLS (TWO CHARACTERS)
    <----->
    ---------------------------
    |1|001|   CHAR  |   CHAR  |
    ---------------------------
    0    4        11        19
    <------20 BIT SHORT------>
          SYMBOL STRING

---SHORT SYMBOL HEADER WITH LENGTH FIELD
       |   INDICATING THREE SHORT SYMBOLS (THREE CHARACTERS)
    <----->
    -------------------------------------
    |1|010|   CHAR  |   CHAR  |   CHAR  |
    -------------------------------------
    0    4        12        20        27
    <---28 BIT SHORT SYMBOL STRING--->
```

FIG. 23C

METHOD AND MEANS PROVIDING STATIC DICTIONARY STRUCTURES FOR COMPRESSING CHARACTER DATA AND EXPANDING COMPRESSED DATA

BACKGROUND

Ziv-Lempel compression compares the next characters from an input data stream to strings in a dictionary until the longest matching string is found, and it then outputs a code for the string, usually an index of the position of the string in the dictionary. Dictionaries have commonly been adaptive: when the longest matching string is found, a new string consisting of the matched string plus one or more additional characters is added. The adaptive process is such that it can be repeated during expansion, provided that the data is expanded in the order in which it was compressed. An adaptive dictionary may grow without bounds, which increases the number of bits needed to express its indices; may grow to a predetermined size, after which it stops being adapted; or may have entries deleted from it to make room for new entries, with the deletion commonly being done by a least-recently-used algorithm. There are various ways of representing a dictionary in storage.

An article entitled "Compression of Individual Sequences via Variable Rate Coding," by Ziv and Lempel, published in September, 1977 in the IEEE Transactions of Information Theory IT-24, pages 530–536, discloses the basic Ziv-Lempel algorithm. A dictionary begins with a single null entry. When the longest string S that matches the next characters from the input is found in the dictionary, then a new entry S+c is formed, where c is the input character after the string that matched S, a code for S and the uncompressed character c are emitted as output data, and matching of input characters is resumed beginning at the input character after c. There is the disadvantage that the c characters in the output data are not compressed.

U.S. Pat. No. 4,464,650 to Willard L. Eastman, et al, issued Aug. 7, 1984, discloses an initially null dictionary (called a search tree) in which, after a match on S, a new entry S+c is formed, with matching then resumed at the character after c. Characters of an alphabet of predetermined size are assigned position numbers in accordance with the order in which the characters are first encountered. A new entry is assigned the next available entry number (called a label), and the next available alphabet-sized set of indices (called virtual addresses) is assigned to the positionally ordered possible future dependent entries of the new entry S+c. The jth potential child of node i has the index $iA-(A-j)+1$, where A is the number of characters in the alphabet. For example, with a four-character alphabet, the null root node has number and index 1, and its four potential children have the indices 2–5. A child will be assigned a number if and when the child is created. A hash table correlates entry numbers to indices during compression or indices to entry numbers during expansion.

When S is matched and entry S+c is formed, a coded form of the index of S+c is emitted, and a coded form of c is emitted if this is the first encountering of c. A coded form of c is not required to be emitted if c has already been encountered because then c is determinable from the index of S+c. Note that the dictionary has many more indices than nodes, which is why encoding of the indices is required.

U.S. Pat. No. 4,558,302 to Terry A. Welch, issued Dec. 10, 1985, discloses a dictionary that optionally may be initialized with all characters of an alphabet (and it is assumed here that it is so initialized). After a match on S, a new entry S+c is formed, with matching then resumed AT c. The index of S is emitted, but c is not emitted since the value of c will be known by means of the index of the next match since c will be the first character of the next match. A dictionary entry contains simply the index of a prefix (S) and an extension character (c).

During compression, the index of entry S+c is found by hashing the index for S and the character c. During expansion, when entry S+c is identified by an index in the compressed data, c is extracted from the S+c entry, and then the index of S in the S+c entry is used to access the S entry; hashing is not required during expansion. U.S. Pat. No. 4,464,650 (Eastman) is cited as being unsuitable for high-performance implementations because of utilizing time consuming and complex mathematical procedures such as multiplication and division to effect compression and expansion (column 3, line 44).

U.S. Pat. No. 4,814,746 to Victor S. Miller, et al, issued Mar. 21, 1989, assigned to the same assignee as the present application, discloses similarly to U.S. Pat. No. 4,558,302 (Welch) and also discloses elimination of dictionary entries, to make room for new entries, by means of a least-recently-used algorithm that may delete entries having no dependent entries (leaves of the tree that is the dictionary). The Miller patent also discloses formation of a new entry from S'+S, where S is the current match and S' is the previous match. After a match on S, matching is resumed at the character following S in the input data stream. Formation from S'+S hastens adaptation to long strings. The embodiment includes a discriminator tree and an array of strings that is the actual dictionary.

An entry in the string array represents either a single character (it contains the character) or S'+S (it contains pointers to the S' and S entries).

A node in the discriminator tree points to a string array entry and contains the length of the represented string. The discriminator tree is traversed during matching by hashing the current node and the next input character after the string whose length is given by the current node. A final match may be on either the array entry designated by a discriminator node or the S' prefix of that entry.

A system in which a child node always represents only one extension character (a character on the right of the prefix represented by the parent) is called character extension. A system in which a child may represent multiple extension characters is called symbol extension.

European Patent Application 350,281 by Alan D. Clark, filed Jul. 4, 1989, forms a new entry from S+c and structures the dictionary as a tree. It discloses a down pointer in a parent node to the first child of the parent, a right pointer in a child to the next sibling of the child, and a parent pointer in each child to the parent of the child, with the parent pointer necessary only for expansion.

A paper by H. D. Jacobson, titled "Some Measured Performance Bounds and Implementation Considerations for the Lempel-Ziv-Welch Data Compaction Algorithm," in International Telemetering Conference Proceedings v 28 1992, published by International Foundation for Telemetering, Woodland Hills, Calif., describes a character extension 2K-entry dictionary structured as a 2K times 256 array of 11-bit entries. This structure permits any of 256 possible child nodes of a parent node, each child representing a different extension character, immediately to be tested for existence and located.

All of the above referenced patents and paper pertain to an adaptive dictionary that is useful for compressing and expanding long sequential data streams for either archiving or network transmission. Data must be expanded in the order in which it was compressed so that the the dictionary during expansion will have, for each string processed, the same contents it had during compression. U.S. Pat. No. 5,087,913 to Willard L. Eastman, issued Feb. 11, 1992, uses the same dictionary (search tree) and adaptive entry-formation processing as in the above referenced U.S. Pat. No. 4,464,650 (Eastman), but it discloses entry formation by a preprocessor from a sample of the data to be compressed, and then freezing of the dictionary (no further adaptation) when either the sample is exhausted or the storage space for the dictionary is full. The advantage is that after an input data stream has been compressed, individual short records in the compressed data can be expanded and examined and possibly changed and recompressed in random order, which is appropriate for a data base of records that are constantly being read and updated in random order.

SUMMARY OF THE INVENTION

The invention defines static dictionary structures for compressing and/or expanding data. A program is to make one or more pass over the data base, sampling some or all of the records in the data base, and construct dictionaries as defined by the invention, which then can be used to compress or expand records by methods that are a further part of the invention.

The subject invention provides novel internal structures for entries in a ZL dictionary that speed up the compression or expansion process for a data record. This novel entry structure enables plural characters to be contained in a single entry, along with information fields and unique control fields that enable compression determinations to be made in advance of accessing entries involved in the determinations, resulting in fewer memory accesses per compression symbol for faster compression operations. Also, expansion operations are speeded up by handling multiple characters per operation.

The invention also increases the speed of the compression and expansion processes by using separate compression and expansion dictionaries. This obtains efficiencies in the use of the space internal to the dictionary entries that is not obtainable with a single dictionary for both compression and expansion.

Where storage space is important, a single static dictionary may be used with the invention for both compression and expansion to increase the speed of processing. However, the separate dictionaries provide maximum speed of operation.

Thus, a static compression dictionary is provided at a transmitting location that must store or transmit uncompressed records. And a static expansion dictionary is provided at locations which receive and process compressed data records from storage or from a distant computer system over any type of digital transmission means, such as telephone lines, microwave, fiber lines, etc. If a location does only transmitting or receiving, but not both, that location need only have either a static compression dictionary or a static expansion dictionary, but not both. Thus, the invention enables compression and expansion to be handled as separate and independent processes.

Further, the invention provides static ZL dictionaries structured to hardware characteristics found in its computer system to significantly improve the speed at which data records can be compressed or expanded by a computer system. This is done by matching the size of the entries in the dictionary to the data unit size accessed from the computer memory.

In advance of summarizing the features of this invention that enable the above described benefits, following is further information about the ZL method and the way in which this invention is related to that method.

As in the case of the previously known dictionaries, the single or separate dictionaries of this invention are structured in the form of a tree, which may be visualized as a downward growing tree. The tree has a conceptual null root node or entry, from which depend 256 actual topmost entries, each of which is considered a child of the null root. These topmost 256 entries are called alphabet entries, and they correspond to the 256 possible values of an eight bit byte. Each alphabet entry may be a parent entry having child entries, and each of those child entries may in turn be a parent entry having its own child entries, etc.

In either the previous dictionaries or the dictionaries of this invention, each entry represents one or more extension characters that follow on the right of all of the extension characters represented by all of the entry's ancestors to form a ZL string, which string is herein called a character symbol. Thus, each dictionary entry represents not only one or more extension characters but also a complete character symbol, as just defined.

Using either a previous dictionary or the subject invention, compression is obtained by comparing the characters in an input string, left to right, against extension characters in the dictionary for as long as matching characters can be found. Then, when the last possible match has been found by means of the extension characters of the last matching dictionary entry, the index of that entry, which is herein called an index symbol, is outputted as the compressed data.

The compression process is then continued at the next character, which is the first unmatched character, in the inputted character sequence from a record.

It can be seen in the above that an index symbol identifies a dictionary entry that represents a character symbol (a ZL string), and so the index symbol identifies that character symbol.

Because of the binary nature of most modern computer systems, the number of entries in a dictionary is always, in these systems, the number 2 raised to some power. The number of bits in an index symbol for a particular dictionary is that power, and this number is often or usually much smaller than the number of bits in the character symbol identified by the index symbol. This is what provides the desired compression.

Using either a previous dictionary or the subject invention, expansion is obtained by processing a sequence of index symbols, left to right, and using each index symbol to locate a dictionary entry and then outputting the character symbol represented by the entry. When a previous dictionary is used, the character symbol is reconstituted by obtaining extension characters from the located dictionary entry and from each of the ancestors of that entry. The subject invention includes novel means by which the reconstitution process can be done through accessing of a smaller number of dictionary entries.

The subject invention is first described herein by introducing and illuminating many of its features as applied to a single static dictionary used for both compression and expansion. The invention is then further described by showing the preferred embodiment, which is separate static compression and expansion dictionaries. The inventors have discovered the preferred embodiment through study of the features when applied to the single dictionary.

Features provided in the subject invention when a single dictionary is used include:

1. Making dictionary entries be of a fixed power-of-2 length and placing the entries contiguously in storage. This allows an index symbol to be used most rapidly to locate the dictionary entry that the symbol identifies. This locating is done by appending some number of zero bits on the right of the index symbol and then adding the result to the starting address of the dictionary to form the address of the identified entry. The length eight bytes has been been found to be the optimal length based on the data transferring capability of the computer system and on the types and amounts of information that are desired in an entry.

2. Omitting in an alphabet entry the extension character (EC) represented by the entry. This saves space in the entry, which space can then be used for other information in the entry.

3. Placing in an entry, other than an alphabet entry, either one or multiple ECs that are to be considered as appended on the right of the ECs contained in all of the ancestors of the entry. The multiple ECs in an entry allow multiple characters in the input string to be compared against through accessing of only the single current entry instead of multiple entries, and they increase the information density in the dictionary, resulting in better compression because longer ZL strings can be represented by a given number of entries. The ECs after the first of the multiple ECs are sometimes called additional ECs (AECs).

4. Placing in an entry, other than an alphabet entry, not only the ECs that are newly represented in a ZL string by the entry but also, possibly, some number of the ECs represented by some number of the nearest ancestors of the entry. Those ECs that are represented by the ancestors are sometimes called predecessor ECs (PECs). The ECs that are newly represented by an entry are sometimes called true ECs (TECs). The PECs in an entry are placed on the left of the TECs in the entry. Placing PECs in an entry allows, during expansion, the PECs to be obtained from the current entry without accessing the ancestor entries.

5. Possibly placing in an entry, other than an alphabet entry, a pointer to an ancestor of the entry. This pointer is called a predecessor pointer (PPTR), is the index of the ancestor, and is used during expansion. The ancestor may be the parent of the current entry, or it may be a more distant ancestor. A PPTR is required when the character symbol represented by the current entry is so large that all of the ECs in the symbol cannot be contained in the current entry. An entry designated by a PPTR may in turn also contain a PPTR. It may be necessary, when reconstituting a character symbol during expansion, to proceed upwards through a sequence of dictionary entries by means of PPTRs. The novel use of PECs and PPTRs in this invention typically allows fewer dictionary entries to be accessed during the expansion of an index symbol than had to be accessed during the formation of the index symbol during compression.

6. Placing in an entry, other than an alphabet entry, a symbol length (SL) field that contains a count of the total number of ECs in the entry and in all of the ancestors of the entry. This allows, during expansion, the length of the character symbol represented by the entry immediately to be known, which allows determination of whether there is room for the symbol in the output buffer. When the rule is adopted that an EC is not placed as a PEC in the current entry if it appears as an EC in the entry designated by a PPTR in the current entry, the following rules for using the SL become available. If an entry does not contain a PPTR, the SL in the entry specifies the number of ECs in the entry. If an entry contains a PPTR, the SL in the entry minus the SL in the entry designated by the PPTR specifies the number of ECs in the entry, and the SL in the entry minus the SL in the parent of the entry specifies the number of TECs in the entry. If the parent is an alphabet entry, it has an implied SL equal to one. Because of how this invention structures entries in the single compression and expansion dictionary, an entry is known not to contain a PPTR if it has a SL of 7 or less and has no children, or if it has a SL of 5 or less and has a child.

7. Placing the children of a parent in a list of contiguous entries in storage, and designating the first entry in the list by means of a child pointer (CPTR) in the parent. The CPTR is the index of the first child. Because the children are contiguous, no control information is needed in a child to locate the next child, which saves space in the child for other information.

8. Placing a bit in an entry to indicate, when the bit is one, that the entry has children and, thus, contains a CPTR. This bit, called a child bit (C), allows the space required by a CPTR to be used for other information when a CPTR is not present. This bit also allows it to be known immediately, when the bit is zero, that the matching process is ended because the current entry has no children.

9. Placing a duplicate of the first TEC of each of some number of the initial children of a parent in the parent, in which case each of these duplicate ECs in the parent is called a child character (CC). The CCs in the parent allow these CCs to be compared against the next character of the input string without the need to access the children to obtain the identical ECs that are in the children. Only if a CC compares equal does it become necessary to access the corresponding child entry to continue the matching process. If there is a match on a CC, the index of the corresponding child is calculable from the CPTR in the entry and the positional number of the matching CC in the set of CCs in the entry. The amount of space available in an entry to contain CCs depends on the number of ECs (PECs and TECs) in the entry and on whether the entry contains a CPTR or PPTR. When there is a match on a CC, it is not yet known whether there is a match on the corresponding child because the child may contain two or more TECs (one or more AECs) instead of only the one TEC to which the CC is identical.

10. Placing a bit in an entry to indicate, when the bit is one, that the entry has more children than are represented by the CCs in the entry. This bit, called a more-children bit (M), is used if there is not a match, by means of CCs and AECs, on any of the children represented by CCs in the entry. When there is no such match and M is one, the first child after the last child represented by a CC in the entry must be accessed in order to compare its first TEC and its AECs, if any, to the next character or characters in the input string.

11. Placing a bit in an entry to indicate, when the bit is one, that the entry has a sibling that follows the entry in the current child list, where two entries are called siblings if they both are children of the same parent. This bit, called a more-siblings bit (S), is used only in an entry that may be accessed due to an M bit in the entry's parent or an S bit in a preceding sibling or in a sibling descriptor, which is to be described.

12. Placing a duplicate of the first TEC of each of some number of the following siblings of the current entry in the current entry, in which case each of these duplicate ECs in the current entry is called a sibling character (SC). The SCs in an entry allow these SCs to be compared against the next character of the input string without the need to access the siblings to obtain the identical ECs that are in the siblings. Only if an SC compares equal does it become necessary to access the corresponding sibling to continue the matching process. If there is a match on an SC, the index of the corresponding sibling is calculable from the index of the current entry and the positional number of the matching SC in the set of SCs in the entry. SCs are placed in an entry only if the entry does not have children. SCs are placed in the space that would be used to contain CCs if the entry did have children.

13. Indicating the end of a CC list or SC list in an entry, in the case when there are fewer CCs or SCs than can fit in the entry, by placing on the right of the last CC or SC a character equal to the last CC or SC in the entry. This avoids the requirement to devote space in the entry to contain an explicit count of the number of CCs or SCs in the entry, thus saving space for other information. This feature requires that none of the first TECs of the children of a parent be identical.

14. Placing a special kind of entry, called a sibling descriptor (SD), within a child list to contain only SCs corresponding to the following siblings in the child list. The dictionary entries that are not SDs are now called character entries (CEs) when it is necessary to distinguish them from the SDs. Note that an SD occupies a dictionary index position that would otherwise be available to contain a CE. The purpose of an SD is to compensate for that there is not room in a parent to contain CCs, or there is not room in a preceding sibling to contain SCs. As in the case of CCs in a parent or SCs in a preceding sibling, the SCs in an SD allow comparison of the next character in the input string to the first TECs of the following siblings without the need to access the following siblings, thus avoiding accesses and thus speeding up the compression process. An SD is distinguished from a CE by a special value of a control field in each of the two types of entries. The presence of an SD is indicated either by an M bit in the parent or by an S bit in a preceding sibling or SD. An SD, like a CE, can contain an S bit. A child list may contain some number of children followed by an SD, followed by the siblings indicated by the SCs in the SD, followed by another SD, etc. The end of the SC list in an SD may be indicated in the same way as in a CE, or it may be indicated by the value in the SL field since SL is not used in its normal way in an SD.

The description of the features of this invention as related to a single dictionary is now concluded. To facilitate remembrance of the acronyms used in that description, which acronyms will frequently be further used, they are listed as follows:

AEC Additional extension character; a TEC after the first TEC in an entry.

C bit Child bit; indicates an entry has children and contains a CPTR.

CC Child character; a character in a parent, which character is identical to the first TEC in a positionally corresponding child.

CE Character entry; a dictionary entry other than an SD. The simple term "entry" usually means a character entry.

CPTR Child pointer; the index of the first child of an entry.

EC Extension character; a character in an entry that is part of the ZL string represented by the entry.

M bit More-children bit; indicates an entry has more children than the number of CCs in the entry.

PEC Predecessor EC; a character in the current entry that is also an EC in the parent or a more distant ancestor of the current entry; the PECs in the current entry precede the TECs in the entry.

PPTR Predecessor pointer; the index of an ancestor of an entry.

S bit More-siblings bit; indicates an entry has more siblings than the number of SCs in the entry; the entry may be a CE or an SD. S being one indicates the presence of either a following CE or a following SD.

SC Sibling character; a character in an entry, which character is identical to the first TEC in a positionally corresponding sibling.

SD Sibling descriptor; a dictionary entry other than a CE; an SD contains only a control field and SCs.

SL Symbol length; a count of the total number of ECs in the entry and in all of the ancestors of the entry.

TEC True EC; an EC that does not appear in an ancestor entry; thus, an EC that is not a PEC.

The inventors have discovered some disadvantages of the single dictionary used for both compression and expansion, as follows.

Placing PECs in an entry improves expansion performance but, since it allows less room or no room for CCs or SCs, it decreases compression performance. Thus, the presence of PECs biases the dictionary for good expansion performance, and the absence of PECs biases the dictionary for good compression performance. It should be desired to have the best possible performance during each of compression and expansion.

The calculations for determining the number of ECs and TECs in the current entry based on the SL in the current entry, the SL in the entry designated by a PPTR in the current entry, and the SL in the parent of the current entry are time consuming, and this reduces compression and expansion performance.

Placing a duplicate of a TEC in the parent as a CC or in a sibling or an SD as an SC means that the same character is in the dictionary twice, which makes less space available for other information.

The technique of indicating the end of a CC list or SC list in a CE or an SC list in an SD by means of a character equal to the last CC or SC requires repeated comparisons of characters, which is more time consuming than the use of a simple count of the number of CCs or SCs.

The requirement that none of the first TECs of the children of a parent be identical, which requirement exists for the purpose of providing the means of indicating the last CC in the parent or the last SC in a sibling or SD, prevents an effective dictionary structure in the case of long strings of varying numbers of the same repeated character, for which strings it is desired that two or more children begin with the same TEC.

The inventors have found that the most space is available in a dictionary entry for PECs, TECs, CCs, and SCs in the entry if the control information in the entry is arranged as follows. The C, M, and S bits, and also a five bit SL, are placed within one byte, except that C and M can be placed within four bits in an alphabet entry since an alphabet entry does not contain S or SL. Also, each of a CPTR and a PPTR is within a separate 12 bit field, which may or may not be required in an entry. The five bit SL length limits the maximum character symbol to 32 characters. (An excess one notation is used wherein the value represented by the SL is one more than the physical value in the SL field.) The 12 bit CPTR or PPTR length limits the maximum number of entries in the dictionary to 4K (4096). While neither of these limits, 32 and 4K, is excessively small, still, they are limits that may be objectionable.

The above disadvantages are eliminated by the following further features of the invention, which features also include new features not specifically intended to address the listed disadvantages. The following features are numbered consecutively after the features described above. The further features include:

15. Providing separate compression and expansion dictionaries instead of a single dictionary. This allows optimizing the contents of each dictionary for its respective purpose, thus achieving the best possible performance during each of compression and expansion. The expansion dictionary can contain more PECs than in the single dictionary case. The compression dictionary can contain more CCs than in the single dictionary case. Since SDs are still available to contain SCs, and to simplify the handling of a compression dictionary CE, SCs are no longer included in a CE but are included only in SDs. Therefore, the more-siblings (S) bit in a CE is deleted. The optimal length in each of the compression and expansion dictionaries again has been found to be eight bytes. Thus, the separate dictionaries double the space required for the single dictionary given the same number of entries in one dictionary. The single dictionary can be used instead of the separate dictionaries if space instead of performance is at a premium.

16. Eliminating the SL field in an expansion dictionary entry and replacing it with a partial symbol length (PSL) field and a complete symbol length (CSL) field. When the PSL is zero in an entry, this indicates that the character symbol represented by the entry is entirely contained within the entry and has a length given by the CSL in the entry. The character symbol can consist of PECs and TECs, and it is unnecessary to determine how many PECs precede the TECs. During expansion, the character symbol can simply be taken from the entry and placed beginning at the next byte location in the output buffer. An entry in which PSL is zero is called an unpreceded entry. When the PSL is nonzero in an entry, this indicates that the character symbol represented by the entry is only partially contained within the entry. The PSL number of the rightmost characters of the character symbol, which may be PECs and TECs, are in the entry, and the remaining characters on the left of the rightmost characters are in one or more preceding entries of which the first is identified by a PPTR in the current entry. A CSL field is not in the current entry, and the space that would be occupied by the CSL is used to contain part of the PPTR. The entry contains a one byte offset (OFST) field whose contents are the number of bytes between the next byte location in the output buffer and the location beginning at which the PECs and TECs in the current entry are to be placed. Thus, the time consuming calculations using the SL are eliminated. Also, since the maximum value of PSL is 5 and the maximum value of OFST is 255, the maximum possible length of a character symbol is now 260 bytes instead of 32 bytes. An entry in which PSL is nonzero is called a preceded entry.

17. Eliminating the first TEC in a nonalphabet compression dictionary entry and having this EC appear only as a CC in the parent or as an SC in an SD. This saves space in the entry for other information. The first and only TEC already did not appear in an alphabet entry.

18. Eliminating the SL field in a compression dictionary entry and replacing it with an AEC count (ACT) field that contains a count of the number of AECs in the entry. This eliminates calculations when comparing next characters in the input string to AECs in the entry.

19. Eliminating the child bit (C) in a compression dictionary entry and replacing it with a child count (CCT) field that contains a count of the number of CCs in the entry. CCs and a CPTR are present only if CCT is nonzero. The CCT eliminates the need to do character comparisons to detect the end of the CC list, and it allows any number of the children of a parent to have a first TEC that is the same as the first TEC of another child of the same parent, thus allowing improved handling of long strings of the same repeated character.

20. Allowing only three types of combinations of CCT and ACT in a compression dictionary entry. If CCT is 0, ACT can be 0–4. If CCT is 1, ACT can be 0–4, If CCT is greater than 1, ACT can be 0 or 1. The inventors have found that this limitation on combinations provides simpler implementation resulting in faster execution, but that it still provides excellent compression capabilities of the dictionary. When ACT is limited to being only 0 or 1, ACT is a single bit, which saves space in the entry. This single bit is called the double-character entry bit (D).

21. Eliminating the special indication of an SD in an SD, and eliminating the SL in an SD and replacing it with a sibling count (SCT) field that contains a count of the number of SCs in the SD. The SCT eliminates the need to do character comparisons to detect the end of the SC list, and this completes the allowance of children having the same first TEC.

22. Placing in a CE and in an SD a set of bits called examine-child bits (X and Y). There is an examine-child bit (X) in a CE for each CC in the CE, and there is an examine-child bit (Y) in an SD for each SC in the SD. An examine-child bit indicates, when the bit is one, that, if there is a match on the CC or SC to which the bit corresponds, then the child to which the CC or SC corresponds must be examined to continue the matching process. The child must be examined if it has AECs because the AECs may or may not match the next characters in the input string, and, therefore, there may or may not be a match on the child. The child must also be examined if it has children because, if there is a match on the child, the matching process must be continued by trying to find a match on a child of the matching child. If there is a match on a CC or SC and the corresponding examine-child bit is zero, it is immediately known that the child does not have AECs or children and, therefore, that the best possible match has been found. In this case, the child need not be examined, thus saving a dictionary access.

23. Showing a novel method of arranging compression dictionary entries that reduces by 67% the number of storage references that would otherwise be required to compress strings, of many different lengths, of the same repeated character. This novel method is in contrast to an obvious method in which the alphabet entry for the character has one child that represents a second instance of the character, which child in turn has one child that represents a third instance of the character, which child in turn has one child that represents a fourth instance of the character, etc. The novel method exploits the capabilities of this invention that allow AECs in any entry and that allow a parent entry to have multiple children each having the same first TEC (meaning that the parent can contain multiple identical CCs). The lesson of the novel method is that an odd-level parent, of which an alphabet entry is the first instance, has no AEC and 5 children, and the children, in order, have 4, 3, 2, 1, and 0 AECs. The children represent from 5 to 1 more characters than their parent. An even-level parent, which is the first child of an odd-level parent, has 4 AECs and one child, which is the next odd-level parent. The second through fifth children of an odd-level parent do not have a child. However, the method does not prohibit an odd-level parent from having more than 5 children, nor does it prohibit the second through fifth children of an odd-level parent from having children, in case any of these additional children would be useful in forming ZL strings not containing only the same repeated character.

24. Providing a special form of compressed data called a short symbol string. This form is provided when an option called the short symbol option (SSO) is invoked. When SSO is invoked, an index symbol is preceded by a zero bit and is called a long symbol, and the compressed data may include uncompressed characters called short symbols. From one to eight short symbols may be in a string preceded by a four bit short symbol header. The first bit of the short symbol header is a one to distinguish the header from a long symbol. The remaining three bits contain an excess one count of the number of short symbols in the string. During compression, a short symbol is always produced instead of a long symbol that identifies a character symbol consisting of only one character. When from one to eight short symbols are produced in succession, they are placed together in a short symbol string. The inventors have found that the novel SSO improves compression when the data to be compressed is such that some or many two character or longer sequences of the data are not in the dictionary as ZL strings. This is likely to occur for binary data within a byte and also for packed decimal data within a byte. The benefit of SSO decreases as the number of entries in the dictionaries is reduced because then the one bit added to the length of an index symbol to form a long symbol becomes a more significant use of space.

The description of the additional features of this invention as related to separate dictionaries is now concluded. To facilitate remembrance of the additional acronyms used in that description, they are listed as follows:

ACT Additional extension character count; the number of AECs in a compression dictionary entry.

CCT Child character count; the number of CCs in a compression dictionary entry.

CSL Complete symbol length; a count of the number of PECs and TECs in an unpreceded expansion dictionary entry.

D bit Double character entry bit; same as an ACT of 0 or 1.

OFST Offset in bytes from the next location in the output buffer to the location beginning at which the PECs and TECs in this expansion dictionary entry are to be placed; present in a preceded entry.

PSL Partial symbol length; if 0, indicates an unpreceded expansion dictionary entry; if non-0, indicates a preceded entry and is a count of the number of PECs and TECs in the entry.

SCT Sibling character count; the number of SCs in an SD.

SSO Short symbol option.

X bit Examine-child bit for a CC.

Y bit Examine-child bit for an SC.

BRIEF DESCRIPTION OF THE DRAWINGS

FIG. 7 shows a dictionary which is used for both compression and expansion.

FIG. 8 shows a dictionary possibly containing predecessor characters (PECs) in any dictionary entry.

FIG. 9 shows a dictionary possibly containing child characters (CCs) in any entry.

FIG. 10 shows a dictionary possibly containing sibling characters (SCs) in any entry.

FIG. 11A shows a control digit that may be used in the alphabet entries (first 256) in the dictionary, and FIG. 11B shows a control byte that may be used in the nonalphabet entries (after the first 256). FIG. 11C shows a control digit and a child pointer (CPTR) in an alphabet entry. FIG. 11D shows a control byte and a CPTR in a nonalphabet entry, and FIG. 11E shows a predecessor pointer (PPTR) in place of the CPTR. FIG. 11F shows a control byte, CPTR, and PPTR all in the same nonalphabet entry.

FIG. 13 shows an example of the use of F1, F2, F3A, F3, and F4 dictionary entries.

FIG. 15A shows the method of using child characters (CCs) and sibling characters (SCs) to locate dictionary entries. FIG. 15B shows a tree of true extension for FIG. 15A.

FIG. 16A shows the method of using sibling characters (SCs) in a sibling descriptor to locate dictionary entries. FIG. 16B shows a tree of true extension for FIG. 16A.

FIG. 17A shows the Compression Call instruction that is used in the preferred embodiment of the invention and that can be used to perform either compression or expansion. FIG. 17B shows the registers used by Compression CAll.

FIG. 18 shows the formats of the entries used in the separate compression dictionary of the preferred embodiment.

FIGS. 19A and 19B show a flow diagram of the compression process used in the preferred embodiment.

FIG. 20 shows the formats of the entries used in the separate expansion dictionary of the preferred embodiment.

FIG. 21 shows a flow diagram of the expansion process used in the preferred embodiment.

FIG. 22 shows an example of the separate compression and expansion dictionaries. In particular, dictionaries for compressing strings of many different lengths of the same repeated character are shown.

FIG. 23A shows how the short symbol option is included in the preferred embodiment. FIG. 23B shows how an index symbol is changed to a long symbol by the short symbol option. FIG. 23C shows examples of short symbol strings containing uncompressed characters called short symbols.

DETAILED DESCRIPTION OF THE EMBODIMENTS

Figure 1:
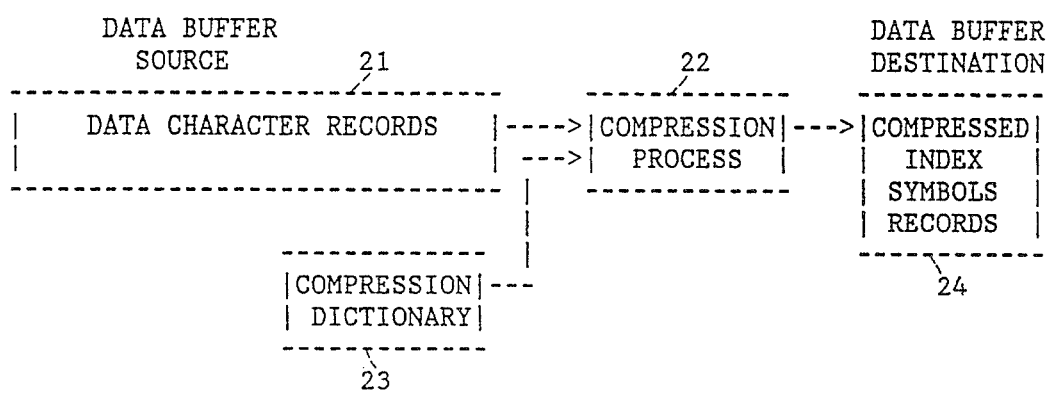
FIG. 1 shows a compression overview used by the preferred embodiment of the invention.

Compression Process Overview—FIG. 1

In FIG. 1, box 21 represents a data source buffer receiving uncompressed records. Source buffer 21 may be in the memory of a computer system which sends the characters in its stored records to a compression process 22 in the order the characters are stored in each record. The process 22 matches the characters received from the current uncompressed record against characters accessed in a compression dictionary 23 to detect character strings within the character sequence of the current record. For each detected string, the compression process 22 outputs an "index symbol" to a data destination buffer 24 in which each compressed record is generated as a sequence of index symbols. A string is detected by process 22 each time an input character cannot match against any currently compared character within the scope of a dictionary entry. The outputted index symbol represents the location in the dictionary of the last matching character in the last detected ZL string. Each mismatching character starts the next ZL string, for which the compression dictionary is reentered to detect the one or more characters in this next ZL string.

When the last character of an uncompressed record is provided to process 22, the last string of the record is ended, and the dictionary location of this last matching character becomes the index symbol outputted to destination buffer 24 to represent the character string in the corresponding compressed record.

The compressed record may then be sent from buffer 24 to its next destination, which, for example, may be to disk storage or to a modem for transmission on a communication line, etc.

Figure 2:
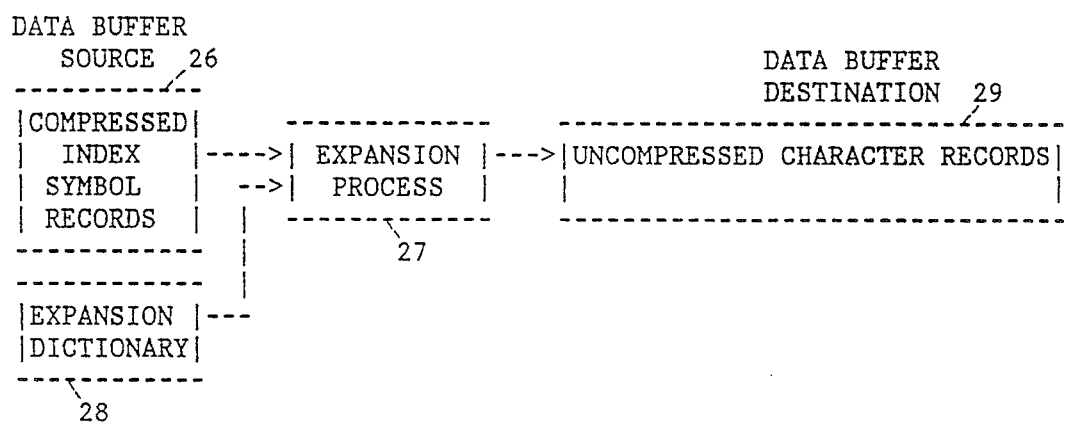
FIG. 2 shows an expansion overview used by the preferred embodiment of the invention.

Expansion Process overview—FIG. 2

FIG. 2 represents the expansion processing of compressed records at a receiving location which receives compressed records and puts them into a source buffer 26, which may be a specified area in the main memory of a computer system. The compressed records may, for example, be received from disk storage or a modem connected to a communication line, etc.

The index symbols comprising a compressed record in buffer 26 are sent to an expansion process 27 that uses an expansion dictionary 28 which may be different from the compression dictionary 23 in FIG. 1. The index symbols are sent to process 27 in their existing order from the beginning of the current compressed record being read in buffer 26.

The expansion process 27 detects each index symbol received from source buffer 26 and uses its value as an index to an entry in expansion dictionary 28 for obtaining all or the rightmost characters of a corresponding uncompressed character string in dictionary 28. Any preceding characters in the selected string are obtained from one or more chained preceding entries in dictionary 28 to reconstruct the uncompressed character string represented by the current index symbol. The characters in the selected string are written into destination buffer 29 beginning at the current cursor position.

Structures for Compression and Expansion Dictionaries

The static Ziv-Lempel method of this invention obtains its best performance by using two dictionaries, which may be located in the memory of a computer system. One is called a "static compression dictionary" and the other is called a "static expansion dictionary" herein. Different unique entry structures are provided for the different types of dictionaries.

The bytes in an uncompressed record are matched against the strings recorded in the dictionary to compress the record. Each string in the uncompressed record that matches a string in the dictionary uses the index in the dictionary of the last character in the string as a compression code, called an "index symbol". The string of uncompressed characters providing the index symbol is called a "character symbol" herein.

The character symbols are of variable length since the number of characters in a string may be any number from one to the maximum string length contained in the dictionary.

The index symbols have a fixed length, which is determined by the number of entries in the compression dictionary. Thus if a dictionary has a length of 512, 1024, 2048 or 4096 bytes, the index symbol length is 9, 10, 11 or 12 bits. The index symbols are placed contiguously next to each other in the outputted "compressed record".

Although the dictionaries used by this invention are organized around the Ziv-Lempel (ZL) algorithm, it should be understood that the ZL algorithm can be implemented in many different ways, of which this invention provides a novel way involving unique structuring of entries in a Ziv-Lempel type of dictionary which has advantages in computer performance.

The Ziv-Lempel algorithm has a prefix property in that for every string in the dictionary, its prefix string is also in the dictionary. That is, if string SB is in the dictionary and is composed of some string S and another single character B, then string S must be in the dictionary. B is called an "extension character" (EC) at the end of the prefix string S, and each character in string S is also an EC. The aforesaid is called "character extension" because a string is extended only one character at at time. The ZL algorithm has also been implemented in the prior art by means of "symbol extension", wherein a prefix string is extended by two or more characters, called a symbol, at a time. The subject invention enables both the the character extension and the symbol extension methods.

The first 256 entries in a ZL dictionary respectively contain all characters of an alphabet, which comprises all characters obtained by all permutations of the bits in an eight bit byte. Every ZL character string begins with one of these first 256 characters in the dictionary, including single-character strings which only have one character. The ECs in entries following the first 256 character entries are in strings having more than one character.

The Ziv-Lempel method translates an uncompressed character sequence into a compressed sequence of fixed length "index symbols", each symbol representing a string of characters in the source character sequence. Given the index symbol sequence as an input, the ZL method expands each of its index symbols into the character string it represents, thereby recreating the original uncompressed character sequence.

Figure 3:
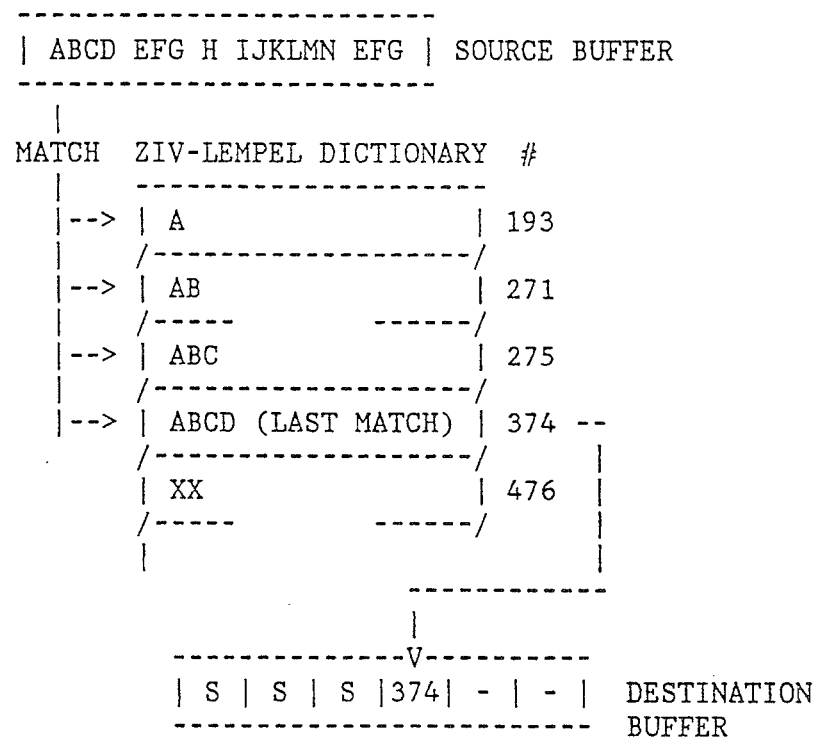
FIG. 3 shows a conventional Ziv-Lempel dictionary with source and destination buffers used for compressing data.

FIG. 3 shows dictionary entries searched for generating the first index symbol in the following example:

| Uncompressed Sequence → | ABCD | EFG | H | IJKLMN | EFG |
|---|---|---|---|---|---|
| Compressed Sequence → | 374 | 442 | 200 | 996 | 442 |

The ZL method uses a compression algorithm to find the longest uncompressed strings that match character strings in the dictionary. The result of each detected string is to identify it by the index (dictionary address) of the last character in the string.

Thus, the ZL compression method executes the following steps:

1. Starting at the current position of the input, find the longest string which is a member of the dictionary.
2. Output an index symbol representing the string by using the location (index) in the dictionary of the last character in the string.
3. Continue the string detection process with the character following the last detected string as the first character of the next string by returning to step 1, if not at the end of the sequence of characters being compressed.

The ZL expansion algorithm follows the reverse process, using the sequence of index symbols obtained from the compression operation as its input to reconstruct the uncompressed character sequence. Note that the entire string is shown as being stored in each entry of the dictionary only for ease of explanation and is avoided in the preferred embodiment.

Figure 4:
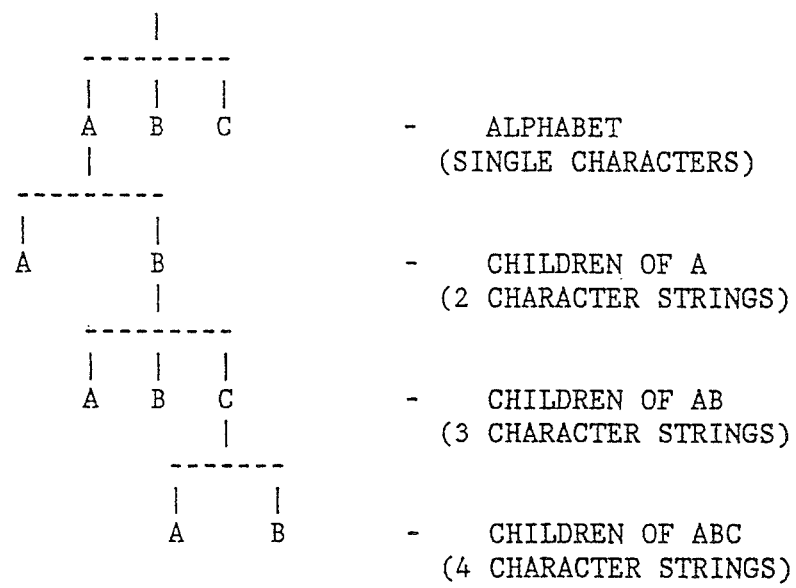
FIG. 4 shows an example of a Ziv-Lempel tree of character strings.

FIG. 4 shows an example of a tree representing these character strings: A, B, C, AA, AB, ABA, ABB, ABC, ABCA, ABCB.

Figures 5, 6:
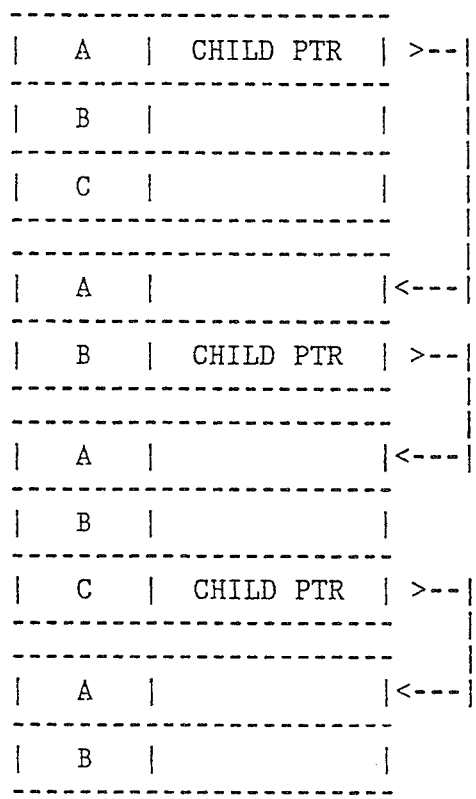
FIG. 5 shows a list form of a dictionary representing the character tree shown in FIG. 4.
FIG. 6 shows a further development of a compression dictionary containing numeric values of the child pointers shown in FIG. 5.

FIG. 5 shows a list form of a dictionary having these same character strings as entries. In the list form, the entries that are children of the same parent entry are placed in a sequential list designated by a child pointer in the parent. Each child entry in the list extends the string of its parent into a different string path in the tree represented by the dictionary; that is, each child in the same child list provides a branch string from the common parent string.

An entry in the dictionary may have a child pointer field. If there is no child pointer, the characters in this entry are the last character of a string. If there is a child pointer, then the entry is a parent, and the pointer locates a list of entries that are children of the parent. Each entry in the child list contains an extension character (EC) which continues a different string from the parent.

FIG. 6 shows a further development of the compression dictionary containing the child lists in FIG. 5. These child lists are placed in sequential locations in the dictionary. The child entries having the same parent EC are in sequential locations in the dictionary, called a "child list". Different child lists need not be contiguously located in the dictionary.

Expansion Dictionary General Operation—FIG. 7

FIG. 7 represents a dictionary for the Ziv-Lempel tree of FIG. 4, which is used for both compression and expansion. In it, the child pointers (CPTRs) are used only for compression, and the predecessor pointers (PPTRs) are used only for expansion. Any dictionary entry therefore may have both CPTR and PPTR fields to support both compression and expansion. The PPTRs allow the characters in an uncompressed string for an index symbol to be reconstructed, by having its characters traced backwards from the index symbol located entry, which locates the last character or characters of a string. The PPTR locates a prior entry having prior character(s) of the string, and it may contain a PPTR to the still prior entry, etc. until the first dictionary entry for the string is found, which is indicated by not having a PPTR value.

For example, the symbol 3 locates entry 3 in the dictionary which contains an EC (A) and a PPTR value of 0, which locates the first entry in the dictionary having another EC (A) which is another character in the same string positioned before the EC found at location 3. Thus, the uncompressed string is thereby reconstructed with the characters AA.

When a PPTR has a value in the range 0 to 255, it is know to designate an alphabet entry. In this case, the alphabet entry is not accessed since it does not contain its own EC. Instead, the value of the PPTR is simply used as the EC represented by the alphabet entry.

Enhancements To The Expansion Operation—FIG. 8

FIG. 8 shows an EC field containing up to 3 characters in any dictionary entry. These characters include at least one TEC represented by the respective entry, which TEC may be preceded on its left by up to 2 predecessor ECs (PECs) within the string. Then all index symbols representing a string of 3 or fewer characters can be expanded by accessing only one dictionary entry, which is the entry at the indexed location. Only entries having more than 3 ECs need a PPTR value to locate the preceding ECs in the string. The expansion operation for the string ends when a PPTR located entry does not contain a PPTR value.

For example, index symbol 9 designates an entry containing an EC of B and a PPTR value that locates entry 7 which contains the ECs ABC. The ABC are concatenated to precede the first EC B forming the string ABCB, which is the complete string because entry 7 does not have any PPTR value, which omission terminates the chained accessing operation.

Child Enhancements to the Compression Operation—FIG. 9

The invention improves the access time even further. To reduce the number of accesses, the invention places the first TEC of each child as a child character (CC) in the parent entry. This eliminates an access of any child entry having a CC in its parent entry that non-compares with the current input character.

FIG. 9 represents an example of a compression dictionary (of FIG. 4) with each entry containing up to 3 child characters. The entry in FIG. 9 also can contain up to 3 EC characters which may be used in expansion in the manner explained in FIG. 8.

If there are more than 3 child characters for an entry in the dictionary, they must be placed in one or more sibling entries or sibling descriptors as sibling characters.

For example, if the string AC was to be compressed using the dictionary structure of FIG. 6, location 0 would be accessed to match on the character A, then locations 3 and 4 would be accessed which contain the children of A. After this, it would be determined that C is not a child of A. With the novel dictionary structure of FIG. 9, location 0 would be accessed as before to determine the match on A. In contrast to the previous procedure, the fact that C is not a child of A may be determined from the dictionary entry in location 0 from the CC fields of this entry. This avoids accesses to entry locations 3 and 4.

Thus, in FIG. 9 up to 3 child characters in the parent entry can be compared with the current input character to determine if any CC does not match the current input character.

If any child does not have a CPTR, then the child has no child characters, and the current string ends with the access of that child entry. Its dictionary location is the index symbol that is the compressed data corresponding to the matched string.

Sibling Enhancements To The Compression Operation—FIG. 10

In FIG. 9, an access is required for a matching CC contained in the parent entry being examined, but no access is done to an entry for which a CC mismatches in the parent.

FIG. 10 continues this type of access avoidance for most additional children of the same parent when the CCs for the additional children cannot be contained in the parent entry due to lack of space in the parent entry. FIG. 10 shows an entry having sufficient space to contain up to 3 sibling characters that are the first TECs of additional children of the same parent. Then a mismatch on any of the sibling characters in the SC field avoids the access of the entry representing that SC.

The locations of the sibling entries is sequential from the last child entry designated by a CC in the parent entry. A sibling entry is simply another child entry in the child list of the parent entry. If no match is obtained with any sibling character in the SC field, the sibling entries designated by those SCs are skipped (not accessed).

Assuming the input string is AX, then, after a non-compare on each of the CCs A, B, and C in entry 0, entries 3, 4, and 5 are skipped, and there is an access of entry 6 first in order to compare the X to the new TEC, D, in entry 6, and then, given a non-compare on D, in order to compare the X to the SCs E, F, and G in entry 6.

Dictionary Entry Length Factor

The length of the entries in the dictionary constrains the combination and number of characters of the various types that can occur in a single entry. The number of entries in the dictionary determines the size of the CPTR and PPTR fields needed to reference the entries.

Although a set of characters may appear appropriate for containment in a single entry, this may not be able to be done in a reasonably sized entry, such as 8 bytes. An entry structure which is dependent on the circumstance of the entry is the best structure for high performance operation.

Another important consideration in the length of the entries is the size of the unit accessed in system main memory and in other fetchable memory hierarchy levels, such as the size of fetchable units in processor caches and registers which transfer the dictionary entries to the processor for execution operations.

Control Field for Dictionary Entries—FIGS. 11A, 11B, 11C, 11D, 11E, and 11F

This invention also provides one or more control fields in dictionary entries for defining varying formats to aid in reducing the number of entry accesses needed for determining the end of the current string in the input character stream for a compression operation and for determining the end of the character symbol for an expansion operation. An important control field may include:

1. Child bit (C)—the current entry has one or more children and contains a child pointer (CPTR).
2. More-children bit (M)—the current entry has more children than the number of child characters (CCs) in the entry.
3. More-siblings bit (S)—the current entry has a sibling following it in the child list.
4. Symbol length (SL)—the number of characters in the dictionary string that includes this entry.

In the control field in an entry, C, M, and S are bit indicators and SL is a count field.

The C bit indicates whether or not the entry has children. When C indicates the entry does not have children, it is indicating the dictionary string ends with the current entry. Then when all ECs in the entry match the input stream, no access to another entry is needed to detect the end of the string.

The M bit is used with the C bit to indicate that a further access to a sibling entry is needed when no CC in the entry matches the current input character. Without the M bit information, it would not be known if the end of the child list corresponds to the last CC in the entry.

The S bit is used in a sibling entry, which is an ordinary character entry in a child list, to indicate that a further access to a sibling entry is needed when no SC in the entry matches the current input character. The S bit is also used for the same purpose in the special sibling descriptor in a child list.

The C bit might be one when there is not room for any CCs in the entry, in which case the M bit need not be examined. Similarly, the S bit might be one when there is not room for an SC in the sibling entry.

The control field can be made smaller for the first 256 entries in the dictionary since they have no siblings (no S is needed) and since their length is predefined to be only a single character, so that no explicit SL field is needed. These 256 entries represent the dictionary's alphabet characters, determined by all of the permutations of the eight bits in a byte. The control field in an alphabet entry is called a control digit (CD) since it is only four bits. The CD is shown in FIG. 11A.

For entries after the first 256, the control field also contains the S bit and SL value, which may be a plurality of bits that can indicate whatever maximum string length is required, where the string always begins with one of the first 256 entries. FIG. 11B shows a control field occupying a byte of eight bits used in entries after the first 256. The control field is called a control byte (CB).

If the dictionary is constrained to having at most 4K (4096) entries, the sizes of the child pointer (CPTR) and predecessor pointer (PPTR) fields can each be 12 bits, which is a convenient size for fitting with the 4 bit CD or the 8 bit CB. In an alphabet entry, which is one of the first 256 entries in the dictionary, the 4 bit CD and a 12 bit CPTR can fit in two bytes, and the next byte and succeeding bytes then can contain CCs, as shown in FIG. 11C. There is no need to place an EC in an alphabet entry.

In a nonalphabet entry, which is an entry after the first 256 entries, an 8 bit CB can fit with a 12 bit CPTR in three bytes, with there then being four unused bits at the end of the three bytes. This is shown in FIG. 11D. An EC can be in the fourth byte in the entry, and it can be followed by other ECs and then by CCs or SCs. The CPTR may instead be a PPTR as shown in FIG. 11E.

A CB, CPTR, and PPTR can be placed together in four bytes as shown in FIG. 11F.

Figure 12:
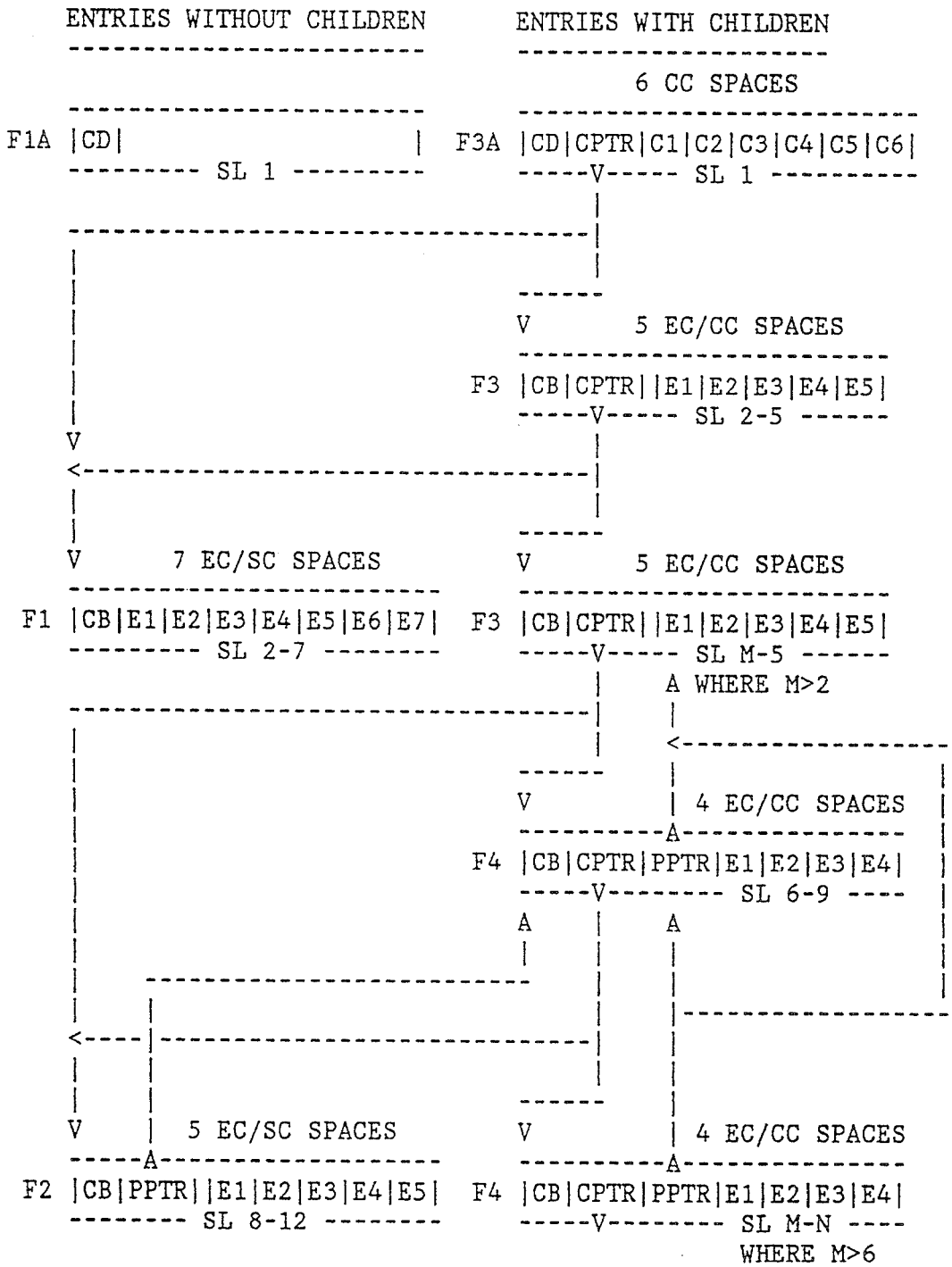
FIG. 12 shows examples of multiple entry formats, F1A, F1, F2, F3A, F3, and F4 which may be used in a dictionary structure.

Multiple Format Dictionary Entries—FIG. 12

FIG. 12 shows examples of multiple entry formats, F1A, F1, F2, F3A, F3, and F4, which may be used in a combined compression and expansion dictionary structure. Formats F1A and F3A are alphabet entries and contain a 4 bit control digit (CD). The other formats are nonalphabet entries and contain an 8 bit control byte (CB). Format F1 is used here to mean a character entry, not a F1 sibling descriptor (SD).

The child bit (C) in the CD in format F1A is zero, indicating no children. Thus, format F1A contains all zeros.

C in the CB in format F1 is also zero. An F1 has space for up to 7 ECs, of which some number of the leftmost ECs may be predecessor ECs (PECs); FIG. 12 does not distinguish between PECs and true ECs (TECs), nor does it distinguish between the first TEC and any additional TECs (AECs).

An F1 is in a child list pointed to by a child pointer (CPTR) in a parent entry, which must have a symbol length (SL) of at least one. (The SL of an F1A or F3A is an implied one.) Thus, the SL in the CB in an F1 can have a value of from 2 to 7. Whatever space in an F1 is not occupied by ECs can be occupied by sibling characters (SCs), but, for simplicity, FIG. 12 shows only ECs labeled E1, E2, etc.. The number of ECs in an F1 is the SL in the F1. The byte offset from the beginning of the EC field in an F1 to the leftmost TEC in the F1 is the SL in the parent of the F1. Any ECs to the left of this first TEC are PECs. The number of TECs in an F1 is the SL in the F1 minus the SL in the parent of the F1.

During expansion when an index symbol designates an F1, the character symbol is all of the ECs in the F1, the number of which ECs is given by the SL in the F1. It is unnecessary to distinguish between PECs and TECs. No other dictionary entry need be accessed to expand the index symbol.

C in the CB in format F2 is also zero. An F2 has space for up to 5 ECs, of which some number of the leftmost ECs may be PECs. An F2 contains after its CB a 12 bit predecessor pointer (PPTR) and then 4 unused bits, leaving space for up to 5 ECs. Whatever space is not occupied by ECs can be occupied by SCs. The number of ECs in an F2 is the SL in the F2 minus the SL in the entry designated by the PPTR in the F2. The byte offset from the beginning of the EC field in an F2 to the leftmost TEC in the F2 is the SL in the parent of the F2 minus the SL in the entry designated by the PPTR in the F2. The number of TECs in an F2 is the SL in the F2 minus the SL in the parent of the F2. The parent of an F2 and the entry designated by the PPTR in an F2 may be the same entry or different entries.

When an entry does not have children, as indicated by a zero value of the C bit in the entry, the entry is an F1 if its SL is 7 or less, and it is an F2 if its SL is 8 or more. This is the way of distinguishing between an F1 and an F2 and, thus, of distinguishing whether the entry contains a PPTR.

FIG. 12 shows a variety of entry combinations. It shows that an F1 may be designated by means of a CPTR (meaning that the entry may be in a child list designated by the CPTR) in an F3A or an F3. An F1 may also be designated by means of a CPTR in an F4, but this is not shown in the figure. The figure shows that an F2 may be designated by means of a CPTR in an F3 or an F4. The figure shows that an F4 may be designated directly by a PPTR in an F2 or another F4, and it shows that an F3 may be designated directly by a PPTR in an F2 or an F4.

C in the CB in format F3A is one, indicating that the entry has children and contains a CPTR. Since there is no EC in an F3A, it being an alphabet entry, there is space for up to 6 child characters (CCs) in the F3A.

C in the CB in format F3 is also one. An F3 has space for up to 5 ECs, of which some number of the leftmost ECs may be PECs. An F3 contains after its CB a 12 bit child pointer (CPTR) and then 4 unused bits, leaving space for up to 5 ECs. Whatever space is not occupied by ECs can be occupied by (CCs), but, for simplicity, FIG. 12 shows only ECs labeled E1, E2, etc.. The number of ECs in an F3 is the SL in the F3. The byte offset from the beginning of the EC field in an F3 to the leftmost TEC in the F3 is the SL in the parent of the F3. Any ECs to the left of this first TEC are PECs. The number of TECs in an F3 is the SL in the F3 minus the SL in the parent of the F3.

C in the CB in format F4 is also one. An F4 has space for up to 4 ECs, of which some number of the leftmost ECs may be PECs. An F4 contains after its CB a 12 bit CPTR and then a 12 bit PPTR, leaving space for up to 4 ECs. Whatever space is not occupied by ECs can be occupied by CCs. The number of ECs in an F4 is the SL in the F4 minus the SL in the entry designated by the PPTR in the F4. The byte offset from the beginning of the EC field in an F4 to the leftmost TEC in the F4 is the SL in the parent of the F4 minus the SL in the entry designated by the PPTR in the F4. The number of TECs in an F4 is the SL in the F4 minus the SL in the parent of the F4. The parent of an F4 and the entry designated by the PPTR in an F4 may be the same entry or different entries.

When an entry has children, as indicated by a one value of the C bit in the entry, the entry is an F3 if its SL is 5 or less, and it is an F4 if its SL is 6 or more. This is the way of distinguishing between an F3 and an F4 and, thus, of distinguishing whether the entry contains a PPTR.

Example of Dictionary Entry Format Use—FIGS. 13, 14A, 14B, 14C, and 14D

Figure 14A:
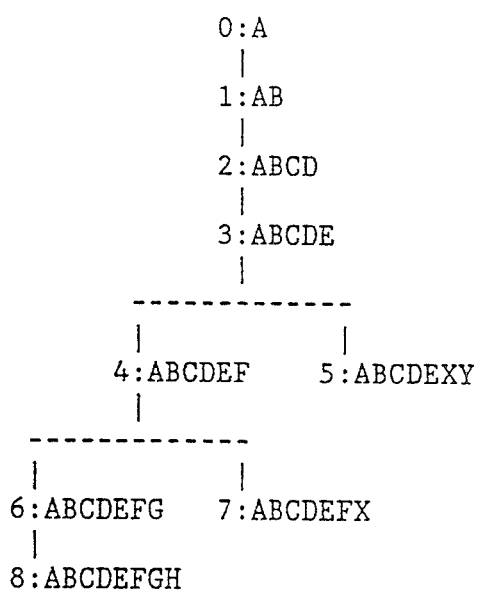
FIG. 14A shows a character symbol tree corresponding to the example in FIG. 13.
Figure 14B:
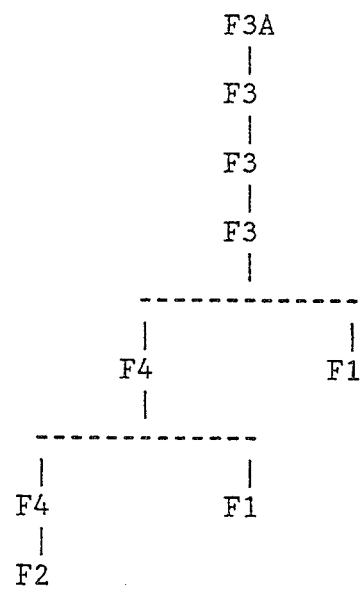
FIG. 14B shows a tree of entry formats for FIG. 13.
Figure 14C:
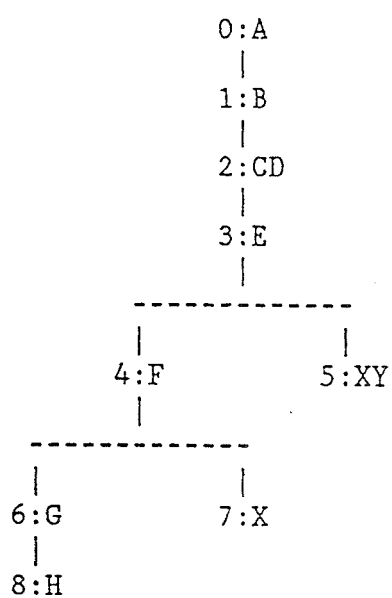
FIG. 14C shows a tree of true extension characters for FIG. 13.
Figure 14D:
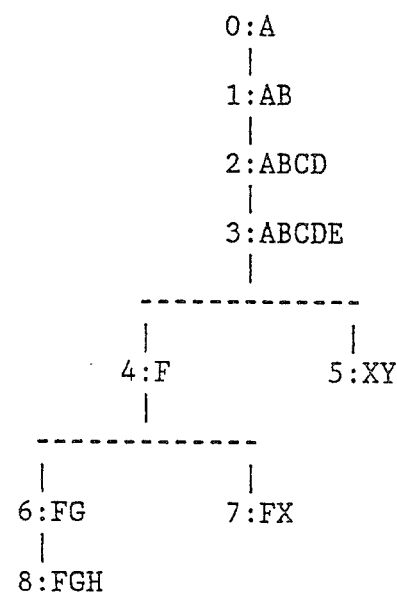
FIG. 14D shows a tree of all extension characters for FIG. 13.

FIG. 13 shows a dictionary corresponding to the character symbol tree shown in FIG. 14A. FIG. 14B shows the formats of the entries in the tree, FIG. 14C shows the true extension characters (TECs) in the entries, and FIG. 14D shows all extension characters, predecessor ECs (PECs) and TECs, in the entries. In FIGS. 14A, 14C, and 14D, the entry location is shown before a colon, and then the character symbol or ECs are shown.

In FIG. 13, the entry at location 0 is the alphabet entry for the character A. The other 255 alphabet entries are not shown, so the next entry is at location 1. Entry 0 (the entry at location 0) is format F3A, contains a C bit but no M bit (meaning it contains a one value of the C bit and a zero value of the M bit), contains a child pointer (CPTR) designating entry 1 as its child, and contains one child character (CC), B, in byte C1. The B in byte C2 is a duplicate of the B in byte B1 and therefore indicates that the B in byte B1 is the last CC.

The entry at location 1 is format F3, contains a C bit and the symbol length (SL) 2, contains the two extension characters (ECs) A, which is a predecessor EC (PEC), and B, which is a true EC (TEC), and contains the CPTR 2 and the CC C. The C in byte C2 indicates that the C in byte C1 is the last CC.

The entry at location 2 contains a C bit and the SL 4, contains the four ECs AB, which are PECs, C, which is the first TEC, and D, which is an additional TEC (AEC), and contains the CPTR 3 and the CC E. Since the M bit is zero, it is known that there is only one child of entry 2.

The entry at location 3 contains a C bit, M bit, and SL 5, contains the ECs ABCDE, of which ABCD are PECs and E is a TEC, and contains the CPTR 4. There is not space in the entry for any CC. For this reason, the M bit is not really necessary since the C bit indicates there is at least one child.

The further description of FIG. 13 describes only the highlights of the figure instead of every detail, those other details being self explanatory.

The F4 entry at location 4 contains a C bit, CPTR, predecessor pointer (PPTR), the TEC F, and 2 CCs, G and X, indicating a child list beginning at location 6. It also contains an S bit indicating that a sibling follows it at location 5. There is no sibling character (SC) for entry 5. The TECs in entry 5 must be examined to determine whether there is a match on entry 5.

The F1 entry at location 5 is a sibling of entry 4. It contains the PECs ABCDE and the TECs XY. Since the entry has no children and has a SL of only 7, it can be an F1 entry containing the complete character symbol instead of being an entry containing a PPTR.

Entry 6 is the first child of entry 4. Since entry 4 contains two CCs, it is known that entry 7 is a sibling of entry 6, and entry 6 need not contain an S bit.

Entry 7 is the second child of entry 4. This is a case of an F1 being a child of an F4 that was mentioned in the description of FIG. 12 but was not shown in that figure.

Entry 8 contains the PECs FG and the TEC H, and it contains a PPTR indicating that the ECs in entry 3 are to be placed on the left of those in entry 8 during expansion of an index symbol that designates entry 8.

Child and Sibling Character Operation—FIGS. 15A and 15B

FIG. 15A shows how the positions of CCs and SCs are used to locate the corresponding children in the child list of a parent. FIG. 15B shows the tree that includes the entries shown in FIG. 15A.

The topmost F3 entry in FIG. 15A is the subject parent. It contains the PEC A and the TEC B, and it contains the CCs ABC. It also contains an M bit, indicating that there are more children than the ABC children.

If there is a match on the CC A in the parent, then, since A is the first CC, the increment 0 is added to the CPTR in the parent to form the index of the corresponding child, the A child. If there is no match on the A CC but there is a match on the B CC, then the increment 1 is added to the CPTR, etc. If there is no match on any of the CCs in the parent, then the increment 3 is added to the CPTR to form the index of the first child after those corresponding to the CCs in the parent. That first child contains the PECs AB and the TEC D, and it contains an S bit and the SC E. Thus, after failing to match on the CCs in the parent, the child at offset index 3 is fetched, and an attempt to match on its TEC D is made, and, if that fails, an attempt to match on its SC E is made. The end of the SC list in this entry is indicated by the duplicate E in byte S2.

If there is a match on the SC E in the entry at offset index 3, then, since that SC is the first SC, the increment 1 is added to the index of the current entry to form the index of the sibling corresponding to the SC. This differs from the case of a CC in a parent, where the increment 0 corresponds to the first CC. The reason for this difference is that the increment for a CC is added to a CPTR, which is the index of the first child, while the increment for an SC is added to the index of the current sibling to form the index of a following sibling.

The M bits in the entries at offset indexes 0 and 4 indicate at least one more child than the ones indicated by the CCs in those entries. Those addition children are assumed in the FIG. 15B tree to have the TEC Z.

Special Sibling Descriptor Entry—FIGS. 16A and 16B

FIG. 16A shows the special sibling descriptor (SD) that is used when a parent has many children, and possibly many ECs in the parent and in its children, and when the children have children such that the immediate children must contain CCs instead of SCs, all of which leads to that there is not much or any space in the parent for CCs or in the immediate children for SCs, which in turn leads to that there would be a large number of accesses of the immediate children to compare the next character of the input string to the first TECs in the children to attempt to find a match. This large number of accesses is prevented by placing an SD in the child list of the parent, which SD contains SCs corresponding to following children in the child list. The next character in the input string is then compared to the SCs in the SD, and any following child in the child list is skipped if there is a non-compare on its corresponding SC in the SD. When SDs are being discussed, the entries in a child list that are not SDs are called character entries (CEs). When there are no SDs, all entries in a child list are CEs.

FIG. 16B shows a tree whose corresponding dictionary entries include those in FIG. 16A.

The topmost entry in FIG. 16A is a parent containing the PECs AB, the TEC C, and the CCs A and B. Given that there has already been a match between the input string and the ECs ABC in the parent, then, if there is match between the next character in the input string and the CC A or B, the increment 0 or 1, respectively, is added to the CPTR in the parent to form the index of the corresponding child of the parent, to continue the matching process. If there is no compare on the CC A or B, the increment 2 is added to the CPTR to form the index of the SD. It is known there is another child of the parent, beyond those corresponding to the CCs A and B, because the M bit in the parent is one.

When the index of the SD is formed, it is not known whether the designated entry in the child list is a CE or an SD. When this entry is accessed, a distinctive code in its control byte (CB) identifies it as a SD. For example, the case when the C bit is zero but the M bit is one can be used to identify an entry as an SD instead of a CE. If the entry were a CE, the next character in the input string would be compared to the first TEC in the CE to continue the matching process. Because the entry is an SD, the next character in the input string is compared to the SCs CDEF in the SD instead. The F in byte S5 of the SD, being a duplicate of the F in byte S4, indicates that the F in byte S4 is the last SC in the SD. If there is a match on the SC C, the increment 1 is added to the index of the SD to form the index of the corresponding child, which then is accessed to continue the matching process. If there is no match on the SC C but there is a match on the SC D, the increment 2 is added to the index of the SD to form the index of the corresponding child, etc.

The SD might contain 7 SCs instead of only 4 as shown. Furthermore, there then might be still more children of the parent than those corresponding to the 7 SCs, in which case the S bit in the SD would be one to indicate that, if there is not a compare on any SC in the SD, another entry after the seventh corresponding child must be accessed to continue matching. That next entry might be a CE or another SD.

Separate Static Dictionary Structures

The preferred embodiment uses two separate dictionaries with different structures, one dictionary for compression and the other for expansion. The dual dictionary arrangement is best provided for static dictionaries because adaptive (dynamic) dictionary update operations would involve regenerating two different dictionaries, which is more difficult than updating a single adaptive dictionary.

Two separate static dictionaries have been found to provide superior performance compared to a single static dictionary used for both compression and expansion, because the single combined dictionary cannot be optimized for both compression and expansion, and its performance can only be biased in the direction of either compression or expansion. It cannot reach the efficiency of separate dictionaries.

The preferred embodiment optimizes the compression dictionary for the compression process without concern for the expansion process, and it optimizes the expansion dictionary for the expansion process without concern for the compression process. This optimization is done by the inventive structures for the entries in the separate dictionaries in the manner shown in FIGS. 18, 20, and 21.

Compression Call Instruction—FIGS. 17A and 17B

The preferred embodiment of this invention provides an instruction named the Compression Call instruction, which is shown in FIG. 17A. Compression Call (CMPSC) performs either compression or expansion as determined by a bit in general register 1 (GR1), which register is used by the instruction. When CMPSC performs compression, it performs as shown in the overview in FIG. 1. When CMPSC perform expansion, it performs as shown in the overview in FIG. 2.

As shown in FIG. 17A, CMPSC has a 4 bit R1 field and a 4 bit R2 field. Each of these fields contains a number that designates an even/odd general register pair (an even numbered register designated by the number in the field, and then also the next higher numbered odd numbered register).

FIG. 17B shows the registers used by CMPSC: general registers R1, R1+1, R2, and R2+1, and also the implicitly designated GR1. R1 and R1+1 contain the 31 bit address and the 32 bit unsigned binary length, respectively, of the destination operand, which is where CMPSC places index symbols during compression or characters during expansion. R2 and R2+1 contain the address and length of the source operand from where CMPSC obtains characters during compression or index symbols during expansion. As part of completing its processing, CMPSC increments the addresses in R1 and R2 and decrements the lengths in R1+1 and R2+1 to reflect the amount of data that was processed in each operand and, thus, to specify the new starting addresses and remaining lengths of the operands.

GR1 contains a 3 bit field, ISS, that specifies both the number of bits in an index symbol, which is the unit of compressed data, and the corresponding number of entries in either a compression or an expansion dictionary. GR1 also contains a bit that specifies whether compression or expansion is to be performed. The further details of these fields are self explanatory in FIG. 17B. Note that an index symbol size of up to 13 bits is possible, which is an improvement over the 12 bit limit in the single dictionary previously described. A larger index symbol size permits a larger dictionary, which allows the dictionary to contain more diverse ZL strings, leading to better compression.

GR1 contains the high order bits of a 31 bit address that designates the location of a dictionary on a 4K (4096) byte boundary. This is a separate compression dictionary during a compression operation, or it is a separate expansion dictionary during an expansion operation.

GR1 also contains a 3 bit compressed data bit number (CBN) field. At the beginning of a compression operation, the CBN designates the bit position in the byte designated by R1 at which the first bit of compressed data is to be placed. At the completion of this compression operation, R1 is updated to contain the address of the first byte in the destination operand containing at least one bit position that does not yet contain a bit of compressed data, and the CBN is updated to contain the number of the leftmost one of those bit positions not containing compressed data. At the beginning of an expansion operation, the CBN designates the first bit of compressed data that is to be processed in the byte designated by R2. At the completion of this expansion operation, R2 is updated to contain the address of the byte in the source operand containing the first bit after the last bit of compressed data that was processed, and the CBN is updated to contain the number of that first bit. The register updating described here, and also the updating of the lengths in R1+1 and R2+2, occurs not only upon completion of the CMPSC execution but also if this execution is interrupted due to, for example, the absence of a virtual page in real storage or an I/O or external interruption.

At completion of the CMPSC execution, the condition code in the program status word (PSW, a standard part of ESA/390) is set to indicate the reason for the completion. The two possible values of the condition code are shown in FIG. 17A. If CC0 is set, the instruction has performed as much processing as was intended since it has compressed or expanded, depending on the operation, the entire source operand. If CC1 is set, the instruction has not processed the entire source operand because the space in the destination operand for receiving the output of the processing became exhausted.

Entry Formats in a Separate Compression Dictionary—FIG. 18

As shown in FIG. 18, there are three formats of the character entry and one format of the sibling descriptor in the compression dictionary of the preferred embodiment.

The formulation of the separate compression dictionary employs many of the concepts and terms that have been described for the single compression and expansion dictionary. The understanding of those descriptions previously given is relied upon in the following description.

As in the single dictionary, the entries in the separate compression dictionary are 8 bytes in length.

Each of the three character entry (CE) formats begins with a 3 bit child count (CCT) field that contains a count of the number of CCs in the entry. The CCT replaces the child bit (C) that was described as being in a CE in the single dictionary. The value in the CCT field distinguishes the three entry formats in an easy way for the CMPSC instruction. When CCT is 0, the format is known to be C0 containing no CPTR or CC but only a 3 bit ACT field whose contents are a count of the AECs in the entry, which count can be from 0 to 4.

In the separate compression dictionary, a CE NEVER contains its first true EC (TEC), which is the first EC newly represented by the CE. This first TEC ALWAYS appears only as a CC in the parent of the entry or as an SC in a sibling descriptor (SD) in the child list under the parent. ACE also NEVER contains any preceding EC (PEC), since PECs are of value only in the expansion dictionary. ACE may, however, contain TECs that the entry represents and that follow its first TEC. These following TECs are called additional ECs (AECs) as they have been previously.

Since a format C0 CE can contain from 0 to 4 AECs, it can represent from 1 to 5 TECs.

A format C1 CE has a CCT of 1. It contains a CPTR and one CC, and, like format C0, it contains an ACT that can be from 0 to 4.

The preferred embodiment of a separate compression dictionary includes a new construct that has not been described in connection with the single dictionary, namely, examine-child bits. In the separate compression dictionary, a parent CE contains an examine-child bit (X) for each CC in the CE. If there is a match on a CC, the associated X is tested for being zero or one. If X is zero, it is immediately known that there is no point to accessing the child entry corresponding to the CC, and it is known, therefore, that the longest matching ZL string in the dictionary has been found for the input string currently being compared against. If X is one, it is known that the child corresponding to the matching CC must be accessed to continue the matching process. X for a child is one if the child has one or more AECs because these AECs must match the input string before it can be true that there is a match on the child. X for a child is also one if the child in turn has its own child or children, because then the matching process can be continued by attempting to match a following character in the input string to a CC in the child and to an SC in an SD under the child. Examine-child bits are not in the single dictionary because the space they require is used more valuably for other information in the single dictionary.

Since a format C1CE contains one CC, it also contains one X, which is in bit position 3 of the CE.

The CC in a C1CE follows the last AEC in the CE. If there is no AEC, the CC begins at bit position 24.

A format CG1CE has a CCT of greater than 1. It contains a CPTR and some number of CCs. It also contains zero or one AECs. Since it can contain at most one AEC, the ACT field in the CG1CE is reduced to a single bit named D. D means double-character entry. When D is one, the first TEC of the CE, which is a CC or SC in another entry, plus the one AEC in the CE cause the CE to represent two TECs. The CCT in the CE can be from 2 to 5 if D is zero, or it can be from 2 to 4 if D is one.

A format CG1 CE also contains an X bit for each of its CCs, and the CE contains an more-children bit (M). The M bit is zero if the CCs in the CE are sufficient to correspond to all of the children of the CE. If the CE has more children than CCs, the M bit is one to indicate more children. When M is one, an SD follows in the child list after the last child corresponding to a CC in the CE.

A sibling descriptor (SD) entry contains a 3 bit SCT field that contains a count of the number of SCs in the SD, which number can be from 1 to 6. An SD also contains an examine-child bit (Y) for each of its SCs, and it contains a more-siblings bit (S). The letter Y is used instead of X for an examine-child bit in an SD to assist in understanding FIG. 20. Y is used for an SC as X is used for a CC.

Figure 19B:
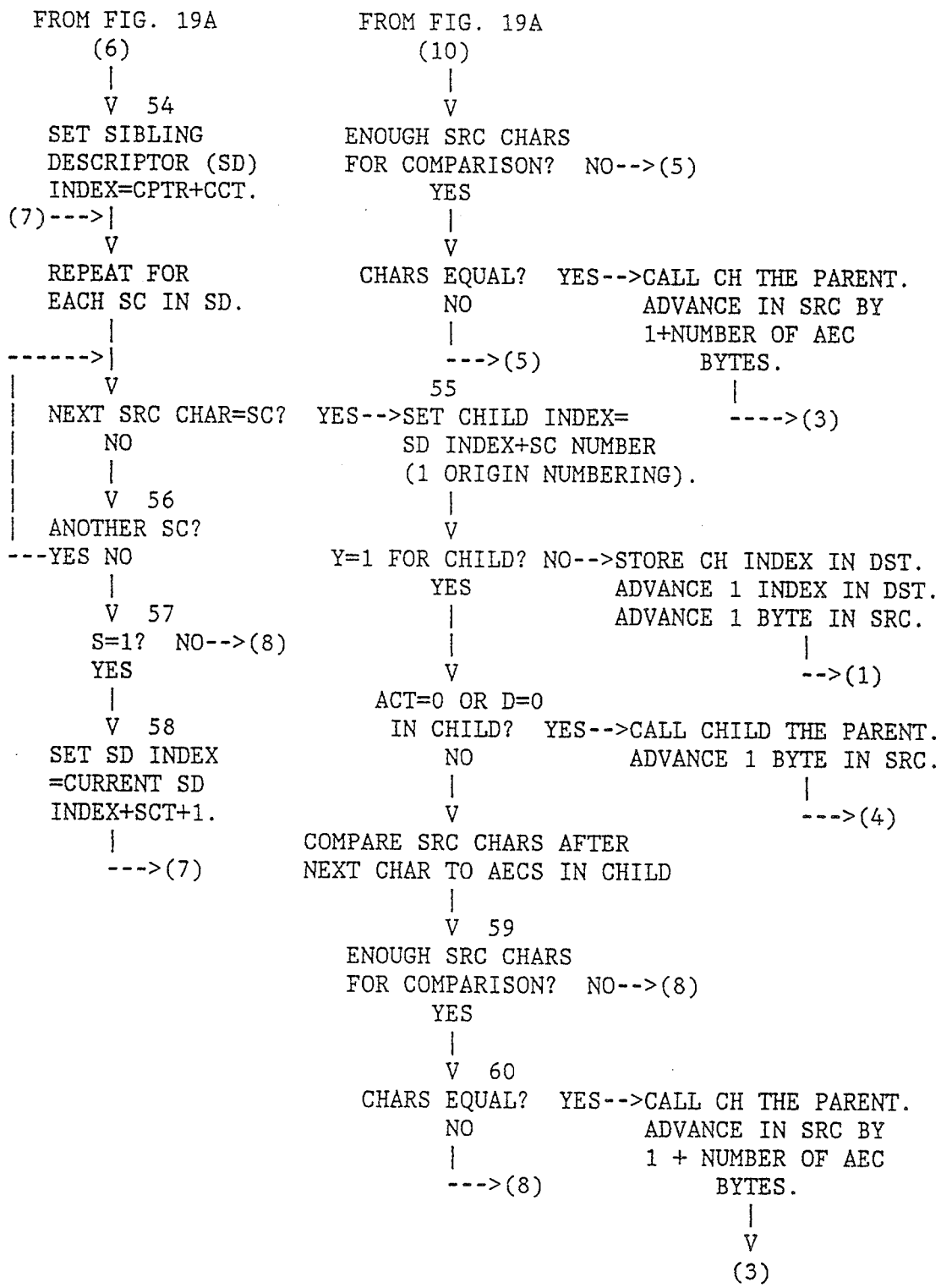

Compression Process—FIGS. 19A and 19B

The preferred embodiment herein uses the general process shown in FIGS. 19A and 19B to compress an input character string with a separate compression dictionary structured with the entries defined in FIG. 18.

In FIGS. 19A and 19B, the points within the process to which control may be given from other points within the process are represented by numbers in parentheses, and some steps of the process are numbered for reference within this description by numbers not in parentheses. The process starts at the top of FIG. 19A at (1).

At (1), the length of the source operand, which is in general register R2+1, is tested for being at least one. If it is zero, CC0 is set, and the execution is ended.

At (2), the length of the destination operand, which is in general register R1+1, and the compressed data bit number (CBN), which is in general register 1, are tested for whether the destination operand contains space for at least one index symbol. The method is described in connection with the operation at (9). If it does not, CC1 is set, and the execution is ended. An index symbol is referred to in FIGS. 19A and 19B simply as an index.

Step 41 uses the character addressed by general register R2 as the index of an alphabet entry in the compression dictionary addressed by the address in general register 1. This entry then is called the parent entry. One is added to the address in R2, and one is subtracted from the length in R2+1.

At (3), the child character (CC) count (CCT) in the parent entry is tested for being zero. If it is zero, control is given to (9), where the index of the parent is stored beginning in the byte addressed by R1 and beginning at the bit position specified by the CBN. The length of the index symbol, which is 9, 10, 11, 12, or 13 bits depending on the index symbol size (ISS) in general register 0, is added to the CBN, and any carry out of the CBN is added to the address in R1 and subtracted from the length in R1+1. For example, if the CBN is initially 5 and the index symbol size is 13 bits, the sum of 5 and 13 is 18, and the CBN is set to 2 bits, and 2 bytes are added to R1 and subtracted from R1+1. Control is then given to (1).

At (4), which is reached when the CCT in the parent is not zero, the source operand is tested for containing another character as at (1). If it does not contain another character, control is given to step 42, in which the index of the parent is stored and R1, R1+1, and the CBN are updated as at (9), CC0 is set, and the execution is ended.

Step 43 begins a loop in which the next character in the source operand is compared against the CCs in the parent beginning with the leftmost CC. If there is an equality, control is given to step 44. If there is not an equality, then, at (5), the CCT in the parent is tested for indicating another CC, and the loop is repeated if there is another CC.

Step 44, which is reached when there is an equal CC, sets a child index equal to the child pointer (CPTR) in the parent plus the number of the equal CC, where the first CC is numbered 0, the next is numbered 1, etc.

Step 45, tests the examine-child bit (X) that is in the parent and that corresponds to the equal CC for being one. If it is zero, it is known that the child does not contain an additional EC (AEC) or have a child, so it is known that the match on the child is complete and is the last possible match. Therefore, in step 46, the child index is stored in the destination operand, the registers, including the CBN, are updated, and control is given to If step 45 finds that X is one, then, in step 47, the child is accessed, and the AEC count (ACT or D) in the child is tested for being zero. If it is zero, it is known that there is a match on the child, so in step 48 the child is called the parent, R2 and R2+1 are updated to advance one character, and control is given to (4).

If step 47 finds that there is an AEC in the child, step 49 prepares to compare the next characters in the source operand to however many AECs are in the child. Step 50 first tests for whether that many characters are left in the source operand. If there are not that many characters, there can be no match on the child, so control is given to (5) to continue with the loop of testing for an equal CC. Note that CCs may be equal to one another, which is profitable for compressing strings of many different lengths of the same repeated character.

If there are sufficient characters left in the source operand, step 51 compares them to the AECs in the child. If there is equality, step 52 makes the child the parent, advances the source registers by 1 plus the number of AECs, and gives control to (3). If there is not an equality, control is given to (5) to continue with the loop of testing for equal CCs.

Step 53 is reached when all CCs have been tested without finding a match on a child. At step 53, the more-children bit (M) in the parent is tested for being one. If it is zero, the match on the parent is known to be the last possible match, so control is given to (8), where the parent index is stored in the destination operand, the destination registers are updated as at (9), and control is then further given to (2).

If step 53 finds that M is one, it is known that there is a sibling descriptor (SD) in the child list after the last child corresponding to a CC in the parent. Step 54 produces the index of the SD by adding together the CPTR and CCT in the parent.

At (7), a loop is begun in which the next character in the source operand, which previously was compared against the CCs in the parent without matching on a child, now is compared against the sibling characters (SCs) in the SD beginning with the leftmost SC. If there is an equality, control is given to step 55. If there is not an equality, then, in step 56, the sibling character count (SCT) in the SD is tested for indicating another SC, and the loop is repeated if there is another SC.

If there was no equality and there is not another SC, step 57 tests the more-siblings bit (S) in the SD for being one. If it is one, then, in step 58, the index of the next SD is produced by adding the SCT in the current SD, plus 1, to the index of the current SD, and then control is given to (7) to continue the matching process using the SCs in the next SD. If S in the current SD is zero, control is given to (8).

Step 55, which is reached when there is an equal SC, sets a child index equal to the index of the SD plus the number of the equal SC, where the first CC is numbered 1, the next is numbered 2, etc.

The steps under step 55 are like those under step 44 except that the NO result of steps 59 and 60 is to give control to (8) instead of (5). Thus, after a match on an SC but then a failure to match the next source characters to AECs, there is not an attempt to find a match on another SC. Note that this preferred embodiment provides that it is useless for SCs to be equal to one another because the second and subsequent ones of these equal SCs will never be compared against a source character. This has been found not to reduce the effectiveness of compressing strings of many different lengths of the same repeated character, and it has been found to speed up compression because it can more quickly be considered that the match on the parent is the last possible match.

Entry Formats in a Separate Expansion Dictionary—FIG. 20

As shown in FIG. 20, the expansion dictionary of the preferred embodiment contains two types of entries: an unpreceded character entry and a preceded character entry.

Both types of expansion dictionary character entries begin with a 3 bit partial symbol length (PSL) field. If this field contains zero, it identifies the entry as an unpreceded entry, and a complete symbol length (CSL) field in the entry contains a count, from 1 to 7, of the number of ECs in the entry. These ECs may consist of predecessor ECs (PECs) as well as true ECs (TECs). It is not necessary to distinguish between PECs and TECs. The processing of an index symbol or predecessor pointer (PPTR) that designates an unpreceded entry results in the placement of all of the ECs in the entry beginning at the next available location in the destination operand. The next available location is the location immediately following the location that received the last character resulting from the expansion of the previous index symbol, or else it is the beginning of the destination operand if the current index symbol is the first index symbol to be expanded.

When PSL is not zero, it identifies the entry as a preceded entry. PSL may then be from 1 to 5, indicating the number of ECs in the entry. The entry contains a PPTR instead of a CSL, and the entry contains a one byte offset (OFST) field. When the entry is designated by an index symbol or by a PPTR, the ECs in the entry are placed in the destination operand beginning at the location whose address is the sum of the address of the next available location and OFST. The PPTR in the entry is then used to access the preceding entry, which may be either another preceded entry or an unpreceded entry.

When an index symbol is expanded through the accessing of some number of preceded entries and then an unpreceded entry, it is to be expected, assuming the dictionary is logically correct, that the ECs in each entry will be placed in the destination operand adjacent to and on the left of the ECs placed due to the preceding entry. But there is no check for whether the dictionary is logically incorrect. If it is incorrect, there may be gaps or overlapping characters in the destination operand.

When an index symbol designates an unpreceded entry, the CSL in the entry is the amount by which the next available location in the destination operand is advanced for the expansion of the next index symbol. When an index symbol designates a preceded entry, the sum of the PSL and OFST in that first preceded entry is the amount by which the next available location is advanced for the next index symbol, and the PSL and OFST in any subsequent preceded entry, and the CSL in the final unpreceded entry, do not participate in calculating that advancement amount.

Since the first (or any) preceded entry can contain a PSL of up to 5 and an OFST of up to 255, the maximum length of the character symbol corresponding to an index symbol is 260 characters.

Expansion Process—FIG. 21

As in FIGS. 19A and 19B, an index symbol is referred to in FIG. 21 simply as an index. Familiarity with the style of the FIGS. 19A and 19B description is assumed.

At (1), the source operand length in R2+1 and the CBN are tested for whether the source operand contains at least one more index symbol. If it does not, CC0 is set, and the execution is ended.

Step 71 tests the next index symbol for having a value of less than 256. If it does, it is known to designate an alphabet entry, and control is given to step 72.

Step 72 tests the destination operand length in R1+1 for whether at least one character position remains in the destination operand. If it does not remain, CC1 is set, and the execution is ended. If the position does remain, then, in step 73, the rightmost eight bits of the index symbol are placed at the location designated by R1 as a character of expanded data; one is added to R1 and subtracted from R1+1; R2, R2+1, and the CBN are updated similarly to as described for control point (9) in FIG. 19A; and control is given to (1).

Step 74, which is reached when the index symbol is greater than 255, uses the index symbol to access a dictionary entry, which then is called the current entry.

Step 75 tests the partial symbol length (PSL) in the current entry for being zero. If it is zero, the entry is known to be an unpreceded entry, and control is given to step 76.

Step 76 obtains the complete symbol length (CSL) from the current entry and then tests for whether the destination operand has CSL character positions remaining in it. If it does not, CC1 is set, and the execution is ended. If it does, step 77 takes the CSL ECs from the entry and places them in the destination operand beginning at the address in R1, updates the registers, and gives control to (1).

Step 78 is reached when the PSL is nonzero, indicating a preceded entry. Since this is the first preceded entry, a variable named SYMLEN (for symbol length) is set with the sum of the PSL and OFST in the entry.

Step 79 tests for whether SYMLEN character positions remain in the destination operand. If they do not, CC1 is set, and the execution is ended. If they do, step 80 takes PSL ECs from the entry and places them in the destination operand beginning at the address in R1 plus OFST. Step 80 then uses the predecessor pointer (PPTR) in the entry to access the entry the PPTR designates, and it then causes that newly accessed entry to become the current entry referred to in this description.

Step 81 tests the PSL in the new current entry for being zero. If it is zero, step 82 takes CSL ECs from the entry and places them beginning at the address in R1. Step 82 then updates the registers and gives control to (1). In particular, step 82 adds SYMLEN to R1 and subtracts SYMLEN from R1+1.

Step 83 takes PSL ECs from the entry and places them beginning at the address in R1 plus OFST. Note that SYMLEN is not changed. Step 83 then uses the PPTR in the entry to access a new current entry, and it then gives control to step 81.

As indicated in the note for steps 80 and 83, if the PPTR is less than 256, the designated entry can be assumed to be an unpreceded entry, and the rightmost 8 bits of the PPTR can be used as the EC in the entry instead of obtaining the EC by accessing the entry.

Dictionaries for Compressing Repeated Characters—FIG. 22

FIG. 22 is useful in providing further understanding of the compression and expansion processes related to separate dictionaries, and it also shows how the provisions of this invention that an entry may contain multiple AECs and that CCs in a parent may be identical are of benefit in compressing strings of many different lengths of the same repeated character. The character A is chosen in FIG. 22 for example. The character consisting of eight zero bits and the blank character are more important cases, but they are unprintable and cannot be as easily shown in the example.

FIG. 22 shows a representation of certain index positions in the compression dictionary and of the same index positions in the expansion dictionary. The character A has the decimal value 193, so the alphabet entry for A at index position 193 is shown. The other alphabet entries are not shown. The descendants of A are shown beginning at index position 256, which is the first position after the alphabet entries.

Since none of the entries shown in the compression dictionary has more children than CCs, the M bit is not shown in FIG. 22.

Following is assistance in understanding the compression dictionary entries.

Entry 193 is shown as having a CCT of 5, 5 corresponding X bits, which are 11110, a D of 0, a CPTR of 256, and 5 CCs each having the value A.

Entry 256 is shown as having a CCT of 1, one corresponding X bit, which is 1, an ACT of 4, a CPTR of 261, 4 AECs each having the value A, and one CC having the value A.

Entry 257 is shown as having a CCT of 0, no X bit, an ACT of 3, no CPTR, 3 AECs each having the value A, and no CC.

With the above explanations of entries 193, 256, and 257 having been given, the rest of the entries in the compression dictionary are self explanatory.

The two columns after the compression dictionary are not part of the dictionaries; they only contain information about the dictionary entries. The number in the first column after a compression dictionary entry is the number of As represented by the entry (and by the same numbered expansion dictionary entry), and the number in the second column is the number of storage references needed to match on the compression dictionary entry. For example, if the input string is AAAAAB, the matching process consists in: (1) referencing entry 193 due to the first A in the string; (2) matching the second A in the string to the first CC A in entry 193, and then referencing entry 256 and finding that the AAAB left in the string does not match the AECs AAAA in entry 256; (3) matching the second A in the string to the second CC A in entry 193, and then referencing entry 257 and finding that the AAA of the AAAB left in the string matches the AECs AAA in entry 257; and (4) finding that, since the CCT in entry 257 is 0, there cannot be a match on the B now left in the string, so that the match on entry 257 is the last possible match. Thus, there have been made 3 storage references in finding this last possible match on the compression dictionary entry representing 5 As.

Following is assistance in understanding the expansion dictionary entries.

Assume the index symbol to be expanded is 270. The first column after the compression dictionary entries indicates that entry 270 in either the compression dictionary or the expansion dictionary represents 16 As. This information is only to assist in understanding this description and is not needed by the expansion process.

Entry 270 in the expansion dictionary contains a PSL of 4, no CSL, a PPTR of 262, 4 ECs each having the value A, and an OFST of 12.

Entry 262 contains a PSL of 5, no CSL, a PPTR of 261, 5 ECs each having the value A, and an OFST of 7.

Entry 261 contains a PSL of 0, a CSL of 7, no PPTR, 7 ECs each having the value A, and no OFST.

Expansion of index symbol 270 consists in: (1) referencing entry 270 and taking the AAAA from the entry and placing it at offset 12 from the next available location in the destination operand; (2) referencing entry 262 and taking the AAAAA from the entry and placing it at offset 7 from the next available location in the destination operand; and (3) referencing entry 261 and taking the AAAAAAA from it and placing it at the next available location in the destination operand. Note that it takes 8 storage references to compress 16 As but only 3 to expand them.

If compression dictionary entries were structured in an obvious way to allow compression of strings of many different lengths of the same repeated character, the alphabet entry for A would have a single child representing a second A, it would have a single child representing a third A, it would have a single child representing a fourth A, etc. The number of storage references needed to match on a string of As would then be equal to the number of As in the string.

The novel pattern of compression dictionary entries in FIG. 22 allows fewer storage references during compression than does the obvious pattern just described. In fact, it allows, in the limit for long strings, a reduction of 67% in the number of storage references. For example, FIG. 22 shows that it takes 4 references to match on 12 As, 6 references to match on 18 As, and 8 references to match on 24 As, so the number of references is 33% of the number of As.

The pattern in FIG. 22 is described as follows. An odd-level parent has no AEC and 5 children, and the children, in order, have 4, 3, 2, 1, and 0 AECs. The children represent from 5 to 1 more characters than their parent. An even-level parent, which is the first child of an odd-level parent, has 4 AECs and one child, which is the next odd-level parent. The second through fifth children of an odd-level parent do not have a child. In FIG. 22, entries 193, 261, 267, 273, and 279 are odd-level parents, and entries 256, 262, 268, and 274 are even-level parents.

The pattern method just described does not prohibit an odd-level parent from having more than 5 children, nor does it prohibit the second through fifth children of an odd-level parent from having children, any of which additional children might be useful for forming ZL strings not containing only the same repeated character.

Short Symbol Option—FIGS. 23A, 23B, and 23C

FIG. 23A shows how a short symbol option can be invoked for use when the data to be compressed is highly random such that many of its two or more adjacent characters do not appear as ZL strings in the dictionary. This is likely to occur when the data is binary or packed decimal data since two adjacent bytes of this data can have so many possible different values.

FIG. 23B shows how, when the short symbol option is used, a zero bit is placed on the left of an index symbol, with the result then being called a long symbol. The index symbol can be of any of the lengths of from 9 to 13 bits, with the long symbol then being of the length 10 to 14 bits, respectively. However, the short symbol option generally should not be used with index symbol lengths of 9 or 10 bits because then the leading zero bit is a more significant use of space that may reduce the degree of compression.

When the short symbol option is used, a long symbol is never produced from an index symbol that represents a character symbol consisting of only one character.

Instead, the single uncompressed character is called a short symbol, and it is placed in the output compressed data in what is called a short symbol string. The short symbol string begins with a 4 bit short symbol header followed by from 1 to 8 short symbols. The header begins with a zero bit to distinguish it from a long symbol, and it then contains a 3 bit count field indicating the number of short symbols in the string. A zero in this count field indicates one short symbol, a one indicates two short symbols, etc.

A short symbol string provides little or even negative benefit to the degree of compression when the string contains only one short symbol. It provides more benefit when it contains multiple short symbols. For example, FIG. 23C shows that a short symbol string of three short symbols is 28 bits. If the index symbol size is 12 bits, three index symbols have a total length of 36 bits, and three corresponding long symbols have a total length of 39 bits.

Many variations and modifications are shown which do not depart from the scope and spirit of the invention and will now become apparent to those of skill in the art. Thus, it should be understood that the above described embodiments have been provided by way of example rather than as a limitation.

Having thus described our invention, what we claim as new and desire to secure by Letters Patent is:

1. An improved method of implementing a well-known Ziv-Lempel (ZL) compression algorithm for compressing any one or more of relatively small small uncompressed records in a relatively large data base to improve compression for the records, comprising the steps of:

pre-generating a static compression dictionary entity (dictionary) before generating compressed records by applying a computer program (utilizing the ZL compression alogirthm) to the data base to generate the dictionary to contain all ZL character strings in the data base as dictionary strings;

structuring each character string in the data base as a dictionary string represented by one or more dictionary entries in which each entry is assigned one or more respective extension characters (ECs) in the dictionary string, in which the assigned EC(s) may or may not be recorded within the dictionary entry and may be called true extension characters (TECs);

chaining or indexing the dictionary entries in a dictionary string from a first entry of any string represented by two or more entries; and generating compressed records from accessed uncompressed records without changing the dictionary whether or not any uncompressed record(s) in the data base have been changed, by the further steps of:

executing another computer program to detect record strings in an uncompressed record by matching a sequence of characters in the uncompressed record against the dictionary strings in the dictionary; and outputting index symbols (that represented ending locations in the dictionary for record strings being matched against dictionary strings in the dictionary) to provide a compressed record corresponding to the uncompressed record.

2. A method of generating a compressed record using the process defined in claim 1, further comprising the step of:

duplicating in any dictionary entry one or more ECs following the ECs assigned to the dictionary entry in the same dictionary string, the duplicates being called child characters (CCs), in order to reduce storage accesses in the dictionary in a process for generating compressed records when record strings can be detected from a CC without accessing a dictionary entry assigned to the child EC.

3. A method of generating a compressed record using the process defined in claim 1, further comprising the step of:

executing a computer program to detect each record string in an uncompressed record by entering the dictionary at a dictionary entry representing a first character in a record string and by comparing each subsequent record character or string of record characters (obtained sequentially from the uncompressed record) with a subsequent dictionary entry in the same dictionary string to determine the end of the record string, and locating the end of the record string either by detecting the last entry in the dictionary string or by detecting an EC in the dictionary string having a mismatch with a next record character following a record character having an equal comparison with an EC in the dictionary string.

4. An expansion process for expanding compressed records generated by the method defined in claim 3 to reconstruct corresponding uncompressed records of a relatively large data base, comprising the steps of:

pre-generating a static expansion dictionary entity (expansion dictionary) before reconstructing any uncompressed record of the data base by applying a computer program utilizing a ZL algorithm to the data base used to construct the compression dictionary, constructing dictionary entries in the expansion dictionary to represent dictionary strings that correspond to dictionary strings in the compression dictionary;

regenerating uncompressed records from inputted compressed records without changing the expansion dictionary whether or not any compressed record(s) in the data base have been generated from any uncompressed records that were changed after the compression dictionary and expansion dictionary were pre-generated, by the further steps of:

executing another computer program to detect index symbols (representing record strings in an uncompressed record) by locating one or more expansion dictionary entries associated with each index symbol in the compressed record;

accessing characters for each record string represented by each index symbol from located expansion dictionary entry(s); and outputting the accessed characters for each index symbol inputted from the compressed record to reconstruct a corresponding uncompressed record.

5. A method of generating a uncompressed record using the process defined in claim 4, further comprising the steps of:

storing the dictionary in a storage of a computer system; and selecting a fixed size for each dictionary entry equal to a size of a storage access unit accessible from the storage of the computer system.

6. A method of expanding compressed records as defined in claim 4, further comprising the step of:

using the same static expansion dictionary to expand any compressed record of the data base even though the compressed record being expanded represents a corresponding uncompressed record that has been changed after the static expansion dictionary was pre-generated so that the static expansion dictionary need not be adapted to the corresponding uncompressed record.

7. A method of expanding compressed records as defined in claim 4, further comprising the step of:
using the static expansion dictionary to expand compressed records obtained from the data base in random order even though the static expansion dictionary was pre-generated by scanning the data base in any order (the same random order, a different random order, or a sequential order) in order to compress and expand records in a way that cannot be done by using an adaptive dictionary.

8. A method of expanding compressed records as defined in claim 4, further comprising the step of:
using the static expansion dictionary to expand compressed records obtained from the data base in random order even though the compressed records were generated by compressing uncompressed records obtained from the data base in any order (the same random order, a different random order, or a sequential order) in order to compress and expand records in a way that cannot be done by using an adaptive dictionary.

9. A method of expanding compressed records as defined in claim 4, further comprising the step of:
storing the expansion dictionary at the receiving end of a network for expanding any compressed record received for the data base.

10. A method of expanding compressed records as defined in claim 4, further comprising the step of:
expanding compressed records utilizing the static expansion dictionary at a receiving end of a network to generate a corresponding uncompressed record without transmitting any dictionary with each transmitted uncompressed record.

11. A method of expanding compressed records as defined in claim 4, further comprising the steps of:
providing one or more predecessor dictionary entries in the expansion dictionary chained to the entry located with an index symbol, when more ancestor characters exist in the associated dictionary string than are contained within the entry located with an index symbol; and
duplicating in the entry located with the index symbol one or more ancestor ECs represented by predecessor entry(s) to enable outputting of ancestor ECs in the string without accessing associated predecessor entry(s).

12. A method of expanding compressed records as defined in claim 11, further comprising the step of:
duplicating in a predecessor entry one or more ancestor ECs of the predecessor entry in the string when the entry located with an index symbol cannot contain all ancestor ECs in the string to enable outputting of further ancestor ECs without accessing other predecessor entries.

13. A method of expanding uncompressed records as defined in claim 12, further comprising the step of:
providing a predecessor pointer field in each predecessor dictionary entry, except a first predecessor entry, in a chain of dictionary entries in the expansion dictionary when a plurality of ancestor characters exist in the dictionary string.

14. A method of expanding compressed records as defined in claim 11, further comprising the steps of:
structuring a symbol length field (SL) in an expansion dictionary entry to indicate a total number of ECs in a dictionary string from the EC(s) assigned to the entry to an EC that begins the string; and
determining from the SL if space exists in an output buffer to receive characters to be outputted for a current record string.

15. A method of expanding compressed records as defined in claim 14, further comprising the steps of:
outputting ECs for a record string located with an index symbol from chained expansion dictionary entries accessed in their chained order, which is in inverse order to an EC sequence required in a corresponding uncompressed record;
recording in an output buffer the ECs outputted from the chain of accessed expansion dictionary entries in an order that puts the ECs in an order required in the uncompressed record; and
selecting ECs within each of the entries in a sequence required in the corresponding uncompressed record.

16. A method of expanding compressed records as defined in claim 14, further comprising the step of:
indicating in the entry whether all of the ECs (ECs assigned to the entry and ancestor ECs) of an associated record string are contained in the entry in order to indicate no additional accesses of predecessor entry(s) are required to obtain all ECs in the string for the expansion process.

17. A method of expanding compressed records as defined in claim 16, further comprising the step of:
indicating in the entry the number of ECs (ECs assigned to the entry and ancestor ECs) to be taken from the entry and placed in the output buffer when it is already indicated in the entry that not all of the ECs of an associated record string are contained in the entry.

18. A method of expanding compressed records as defined in claim 11, further comprising the step of:
structuring an offset field in an expansion dictionary entry to indicate the position relative to a current cursor position in an output buffer where the EC(s) assigned to the entry and ancestor EC(s) in the entry are to be placed such that when further ECs are then taken from ancestor entries the uncompressed record will have been produced beginning at the current cursor position in the output buffer.

19. A method of expanding compressed records as defined in claim 18, further comprising the steps of:
outputting ECs for a record string located with an index symbol from chained expansion dictionary entries accessed in their chained order, which is in inverse order to an EC sequence required in a corresponding uncompressed record;
recording in an output buffer the ECs outputted from the chain of accessed expansion dictionary entries in an order that puts the ECs in an order required in the uncompressed record; and
selecting ECs within each of the entries in a sequence required in the corresponding uncompressed record.

20. A method of expanding compressed records as defined in claim 18, further comprising the step of:

indicating in the entry whether all of the ECs (ECs assigned to the entry and ancestor ECs) of an associated record string are contained in the entry in order to indicate no additional accesses of predecessor entry(s) are required to obtain all ECs in the string for the expansion process.

21. A method of expanding compressed records as defined in claim 20, further comprising the step of:

indicating in the entry the number of ECs (ECs assigned to the entry and ancestor ECs) to be taken from the entry and placed in the output buffer when it is already indicated in the entry that not all of the ECs of an associated record string are contained in the entry.

22. A method of compressing records as defined in claim 3, further comprising the step of:

storing a child pointer in at least a first entry of a dictionary string to locate a next dictionary entry having a child EC in the dictionary string, each child EC having one or more predecessor EC(s) in the dictionary string.

23. A method of compressing records as defined in claim 12, further comprising the step of:

locating each first dictionary entry of each dictionary string at a location indicated by a value of an alphabetic EC represented by a first dictionary entry, designating each first dictionary entry as an alphabetic entry and designating all other dictionary entries as non-alphabetic entries, and no EC being required in any alphabetic entry due to the location of each alphabetic entry being associated with an assigned alphabetic EC.

24. A method of compressing records as defined in claim 23, further comprising the step of:

structuring the static compression dictionary with fixed length entries containing ECs and control fields.

25. A method of compressing records as defined in claim 24, further comprising the step of:

locating a non-alphabetic dictionary entry by means of a child pointer in an immediate predecessor entry in the same dictionary string.

26. A method of compressing records as defined in claim 24, the structuring step further comprising the step of:

structuring the control field in a non-alphabetic entry with an EC count indication for indicating the number of true ECs assigned to the entry.

27. A method of compressing records as defined in claim 24, the structuring step further comprising the step of:

structuring the control field of an alphabetic entry or of a non-alphabetic entry as a parent dictionary entry (parent entry) containing a child indicator for indicating when the parent entry contains child ECs (called CCs) which are characters in a dictionary string following an EC assigned to the parent entry, so that the CCs can increase the efficiency of detecting record strings in the dictionary by enabling detection of an end of a record string without additional accesses to the child dictionary entries assigned to the CCs.

28. A method of compressing records as defined in claim 27, further comprising the step of:

placing a count indicator in the parent entry indicating the number of CCs contained in the parent entry with it predetermined or indicated in the entry that each CC is either the first EC assigned to an associated child entry or is a set of the first ECs assigned to an associated child entry.

29. A method of compressing records as defined in claim 28, further comprising the steps of:

providing the child dictionary entries of a parent entry to comprise a child list having one or more child dictionary entries (child entries);

locating each child entry in the child list in predetermined location(s) relative to the first child entry in the child list; and assigning each CC in the parent entry to be associated with a respective child entry in the child list.

30. A method of compressing records as defined in claim 29, further comprising the step of:

locating the child list in the dictionary by a child pointer field in the parent entry.

31. A method of compressing records as defined in claim 30, further comprising the step of:

calculating a location of a child dictionary entry from a child pointer and the location of an associated CC in the parent entry comparing-equal with a next record character to be matched against an EC in the dictionary string for generating an index symbol for a record string being currently detected.

32. A method of compressing records as defined in claim 29, further comprising the step of:

setting-on a more-children indicator in a control field of a parent entry to indicate that the parent entry has more child entries in its child list than the number of CCs that are contained within the parent entry.

33. A method of compressing records as defined in claim 32 further comprising the steps of:

placing in a child list under a parent entry (parent) containing a more-children indicator an entry that is not an alphabetic entry or a non-alphabetic entry but is called a sibling descriptor (SD) containing CCs associated with child entries (children) of the same parent whose respective identifying CCs cannot be contained in the space available in the parent, these CCs being called sibling characters (SCs) to distinguish them from the CCs in the parent, with it predetermined or indicated in the SD that each SC is either the first EC assigned to an associated child entry (child) of the same parent or is a set of the first ECs assigned to an associated child of the same parent, so that the SCs can increase the efficiency of detecting record strings in the dictionary by enabling detection of an end of a record string without additional accesses to the child dictionary entries assigned to the SCs;

placing a count indicator in the SD indicating the number of SCs contained in the SD; and assigning each SC in the SD to be associated with a respective child entry in the child list.

34. A method of compressing records as defined in claim 33, further comprising the step of:

locating a SD in a predetermined way relative to the location of the child entry designated by the last CC contained within the parent.

35. A method of compressing records as defined in claim 34, further comprising the step of:

calculating a location of a child entry from the location of a SD containing SCs and the location of an associated SC in the SD comparing-equal with a next record character to be matched against an EC in the dictionary string for generating an index symbol for a record string being currently detected.

36. A method of compressing records as defined in claim 34, further comprising the steps of:
   setting-on a more-siblings indicator in a control field of a SD to indicate that the SD has more SCs than are contained within the SD; and
   placing another SD containing those additional SCs in a predetermined location relative to the location of the child entry designated by the last SC in the first SD.

37. A method of compressing records as defined in claim 33, further comprising the step of:
   omitting an assigned EC from a child entry located by means of an identical SC in a SD in the same child list since the EC is already known if the identical SC has been used to find a match on the child entry assigned to the EC.

38. A method of compressing records as defined in claim 33, further comprising the step of:
   associating an examine-child indicator with a SC in SD to indicate if the SC ends a dictionary string (and therefore detects an end of a record string) when the SC compares-equal with a current record character without requiring an access of any other dictionary entry.

39. A method of compressing records as defined in claim 38, further comprising the steps of:
   setting the examine-child indicator associated with a SC to indicate no access of the associated child entry (child) is required when it has been predetermined that the child has no assigned ECs other than the designating SC and has in turn no child of its own since this indicates no further possible continuation of the matching process; or
   setting the examine-child indicator to indicate an access of the child is required when it has been predetermined that the child has assigned ECs other than the designating SC or has children of its own since then it is not known either that there is truly a match on the child or that no continuation of the matching process is possible.

40. A method of compressing records as defined in claim 33, further comprising the steps of:
   placing the SD in only the compression dictionary in the space that could be occupied by an alphabetic or non-alphabetic entry; or
   placing the SD also in the expansion dictionary at the location in the expansion dictionary identical to that of the location of the SD in the compression dictionary, since this space in the expansion dictionary would otherwise be wasted since the space does not correspond to a location in the compression dictionary containing an alphabetic or non-alphabetic entry and cannot contain ECs to be used for reconstituting an uncompressed record during the expansion operation.

41. A method of compressing records as defined in claim 32, further comprising the steps of:
   placing in a child entry (child) in a child list under a parent entry (parent) containing a more-children indicator CCs associated with children of the same parent whose respective identifying CCs cannot be contained in the space available in the parent, these CCs being called sibling characters (SCs) to distinguish them from the CCs in the parent, with it predetermined or indicated in the entry that each SC is either the first EC assigned to an associated child of the same parent or is a set of the first ECs assigned to an associated child of the same parent, so that the SCs can increase the efficiency of detecting record strings in the dictionary by enabling detection of an end of a record string without additional accesses to the child dictionary entries assigned to the SCs;
   placing a count indicator in the child entry indicating the number of SCs contained in the child entry; and
   assigning each SC in the child entry containing SCs to be associated with a respective child entry in the child list.

42. A method of compressing records as defined in claim 41, further comprising the step of:
   locating a child entry containing SC(s) in a predetermined way relative to the location of the child entry designated by the last CC contained within the parent.

43. A method of compressing records as defined in claim 42, further comprising the step of:
   calculating a location of a second child entry from the location of a first child entry containing SCs and the location of an associated SC in the first child entry comparing-equal with a next record character to be matched against an EC in the dictionary string for generating an index symbol for a record string being currently detected.

44. A method of compressing records as defined in claim 42, further comprising the steps of:
   setting-on a more-siblings indicator in a control field of a child entry containing SCs to indicate that the child entry has more SCs than are contained within the child entry; and
   placing another child entry containing those additional SCs in a predetermined location relative to the location of the child entry designated by the last SC in the first child entry containing SCs.

45. A method of compressing records as defined in claim 41, further comprising the step of:
   omitting an assigned EC from a child entry located by means of an identical SC in another child entry in the same child list since the EC is already known if the identical SC has been used to find a match on the child entry assigned to the EC.

46. A method of compressing records as defined in claim 41, further comprising the step of:
   associating an examine-child indicator with a SC in a child entry to indicate if the SC ends a dictionary string (and therefore detects an end of a record string) when the SC compares-equal with a current record character without requiring an access of any other dictionary entry.

47. A method of compressing records as defined in claim 46, further comprising the steps of:
   setting the examine-child indicator associated with a SC to indicate no access of the associated child entry (child) is required when it has been predetermined that the child has no assigned ECs other than the designating SC and has in turn no child of its own since this indicates no further possible continuation of the matching process; or
   setting the examine-child indicator to indicate an access of the child is required when it has been predetermined that the child has assigned ECs other than the designating SC or has children of its own since then it is not known either that there is truly a match on the child or that no continuation of the matching process is possible.

48. A method of compressing records as defined in claim 27, further comprising the step of:

omitting an assigned EC from a compression dictionary entry when the assigned EC is a CC in a parent entry since the EC is already known if the identical CC has been used to find a match on the child entry assigned to the EC.

49. A method of compressing records as defined in claim 27, further comprising the step of:

associating an examine-child indicator with a CC in a parent entry to indicate if the CC ends a dictionary string (and therefore detects an end of a record string) when the CC compares-equal with a current record character without requiring an access of any other dictionary entry.

50. A method of compressing records as defined in claim 49, further comprising the steps of:

setting the examine-child indicator associated with a CC to indicate no access of the associated child entry (child) is required when it has been predetermined that the child has no assigned ECs other than the designating CC and has in turn no child of its own since this indicates no further possible continuation of the matching process; or setting the examine-child indicator to indicate an access of the child is required when it has been predetermined that the child has assigned ECs other than the designating CC or has children of its own since then it is not known either that there is truly a match on the child or that no continuation of the matching process is possible.

51. A method of compressing records as defined in claim 1, further comprising the step of:

detecting a record string when all ECs in a dictionary entry compare-equal with record characters when an ending indication in the dictionary entry indicates it is the end of a dictionary string.

52. A method of compressing records as defined in claim 1, further comprising the steps of:

extending an index symbol with an indicator of whether the symbol is truly an index symbol designating a dictionary entry or whether the symbol contains a count of a following number of uncompressed characters that appear in their uncompressed form because they are not represented in the dictionary by a ZL string or strings sufficiently long to provide good compression when ZL compression is used; and processing during the expansion process an index symbol with this indicator by moving the number of uncompressed characters indicated by the count from the compressed record to the uncompressed record.

53. A method of compressing records as defined in claim 1, further comprising the steps of:

structuring the dictionary entries in a ZL dictionary string into alternating levels of two types with entries at the first type of level having one assigned EC and multiple (N) children and entries at the second type of level having one or multiple assigned ECs but not necessarily more than one child; and further structuring the entries at the second type of level such that the first child at that level has N assigned ECs, the next child has N-1 assigned ECs, the next child has N-2 assigned ECs, and so forth until the last child has one assigned EC, with the purpose of this structuring being to compress long strings of the same repeated character and of many different lengths by accessing fewer dictionary entries than would be required to be accessed if the structuring were not as defined here.

54. An improved combined method of compressing uncompressed records and of expanding compressed records back to uncompressed records in a relatively large data base by improving computer performance when using a well-known Ziv-Lempel (ZL) algorithm, comprising the steps of:

pre-generating a static dictionary entity (dictionary) containing dictionary entries for performing both compression and expansion operations on records of a data base by generating the dictionary from the data base by applying a computer program utilizing the ZL algorithm to the data base to generate the dictionary to contain all ZL character strings in the data base as dictionary strings;

structuring each character string in the data base as a dictionary string represented by one or more dictionary entries in which each entry is assigned one or more respective extension characters (ECs) in the dictionary string, in which the assigned EC(s) may be called a true extension character(s) (TECs) of the dictionary string;

forward and backward chaining the dictionary entries in each dictionary string in the dictionary;

generating compressed records from accessed uncompressed records without changing the dictionary whether or not any uncompressed record(s) in the data base have been changed, by the further steps of:

executing another computer program to detect record strings in an uncompressed record by matching sequence of characters in the uncompressed record against the dictionary strings in the dictionary; and outputting index symbols (that represent ending locations in the dictionary for record strings being matched against the dictionary strings in the dictionary) to provide a compressed record corresponding to the uncompressed record; and regenerating uncompressed records from inputted compressed records without changing the dictionary whether or not any compressed record(s) in the data base have been generated from any changed records that were changed after the dictionary was pre-generated, by the further steps of:

executing another computer program to detect index symbols (representing record strings in an uncompressed record) by locating dictionary entries associated with respective index symbols in a compressed record;

accessing characters for each dictionary string represented by each index symbol from located dictionary entry(s); and outputting the accesssed characters for each index symbol inputted from a compressed record to reconstruct a corresponding uncompressed record.

55. A method of using the process defined in claim 54, further comprising the step of:

duplicating in any dictionary entry one or more ECs following or preceding the ECs assigned to the dictionary entry in the same dictionary string, the duplicates of the following ECs being called child characters (CCs), in order to reduce storage accesses to the dictionary in a process for generating compressed records when record strings can be detected from a CC without accessing a dictionary entry assigned to the child EC, and in order to reduce storage accesses to the dictionary in a process for regenerating uncompressed records from dictionary strings.

56. A method of generating a compressed record using the process defined in Claim 54 further comprising the step of:

executing a computer program to detect each record string in an uncompressed record by entering the dictionary at a dictionary entry representing a first character in a record string and by comparing each subsequent record character or string of record characters (obtained sequentially from the uncompressed record) with a subsequent dictionary entry in the same dictionary string to determine the end of the record string, and locating the end of the record string either by detecting the last entry in the dictionary string or by detecting an EC in the dictionary string having a mismatch with a next record character following a record character having an equal comparison with an EC in the dictionary string.

57. A method of using the process defined in claim 54, further comprising the step of:

storing a child pointer in at least a first entry of a dictionary string to locate a next dictionary entry having a child extension character (EC) in the dictionary string, each child EC having one or more predecessor EC(s) in the dictionary string.

58. A method of using the process defined in claim 51, further comprising the step of:

locating each first dictionary entry of each dictionary string at a location indicated by a value of an alphabetic EC represented by a first dictionary entry, designating each first dictionary entry as an alphabetic entry and designating all other dictionary entries as non-alphabetic entries, and no EC being required in any alphabetic entry due to the location of each alphabetic entry being associated with an assigned alphabetic EC.

59. A method of using the process defined in claim 58, further comprising the step of:

structuring the static dictionary with fixed length entries containing ECs and control fields.

60. A method of using the process defined in claim 59, further comprising the step of:

locating a non-alphabetic dictionary entry by means of a child pointer in an immediate predecessor entry in the same dictionary string.

61. A method of using the process defined in claim 59, the structuring step further comprising the step of:

structuring the control field in a non-alphabetic entry with an EC count indication for indicating the number of true ECs assigned to the entry.

62. A method of using the process defined in claim 59, the structuring step further comprising the steps of:

structuring in a non-alphabetic entry a count indication in a control field to indicate when the entry contains predecessor ECs and the assigned EC(s) for the same dictionary string; and recording the predecessor ECs in the entry in space not being used by the control field or by the assigned EC(s).

63. A method of using the process defined in claim 59, the structuring step further comprising the step of:

structuring the control field of an alphabetic entry or of a non-alphabetic entry as a parent dictionary entry (parent entry) containing a child indicator for indicating when the parent entry contains child ECs (called CCs) which are characters in a dictionary string following an EC assigned to the parent entry, so that the CCs can increase the efficiency of detecting record strings in the dictionary by enabling detection of an end of a record string without additional accesses to the child dictionary entries assigned to the CCs.

64. A method of using the process defined in claim 63, further comprising the step of: placing a count indicator in the parent entry indicating the number of CCs contained in the parent entry with it predetermined or indicated in the entry that each CC is either the first EC assigned to an associated child entry or is a set of the first ECs assigned to an associated child entry.

65. A method of using the process defined in claim 63, further comprising the steps of:

providing the child dictionary entries of a parent entry to comprise a child list having one or more child dictionary entries (child entries);

locating each child entry in the child list in predetermined location(s) relative to the first child entry in the child list; and assigning each CC in the parent entry to a respective child entry in the child list.

66. A method of using the process defined in claim 65, further comprising the steps of:

locating the child list in the dictionary by a child pointer field in the parent entry.

67. A method of using the process defined in claim 66, further comprising the steps of:

calculating a location of a child dictionary entry from a child pointer and the location of an associated CC in the parent entry comparing-equal with a next record character to be matched against an EC in the dictionary string for generating an index symbol for a record string being currently detected.

68. A method of using the process defined in claim 65, further comprising the step of:

setting-on a more-children indicator in a control field of a parent entry to indicate that the parent entry has more child entries in its child list than the number of CCs that are contained within the parent entry.

69. A method of compressing records as defined in claim 68, further comprising the steps of:

placing in a child entry (child) in a child list under a parent entry (parent) containing a more-children indicator CCs associated with children of the same parent whose respective identifying CCs cannot be contained in the space available in the parent, these CCs being called sibling characters (SCs) to distinguish them from the CCs in the parent, with it predetermined or indicated in the entry that each SC is either the first EC assigned to an associated child of the same parent or is a set of the first ECs assigned to an associated child of the same parent, so that the SCs can increase the efficiency of detecting record strings in the dictionary by enabling detection of an end of a record string without additional accesses to the child dictionary entries assigned to the SCs;

placing a count indicator in the child entry indicating the number of SCs contained in the child entry; and assigning each SC in the child entry containing SCs to be associated with a respective child entry in the child list.

70. A method of compressing records as defined in claim 69, further comprising the step of:
locating a child entry containing SC(s) in a predetermined way relative to the location of the child entry designated by the last CC contained within the parent.

71. A method of compressing records as defined in claim 70, further comprising the step of:
calculating a location of a second child entry from the location of a first child entry containing SCs and the location of an associated SC in the first child entry comparing-equal with a next record character to be matched against an EC in the dictionary string for generating an index symbol for a record string being currently detected.

72. A method of compressing records as defined in claim 70, further comprising the steps of:
setting-on a more-siblings indicator in a control field of a child entry containing SCs to indicate that the child entry has more SCs than are contained within the child entry; and
placing another child entry containing those additional SCs in a predetermined location relative to the location of the child entry designated by the last SC in the first child entry containing SCs.

73. A method of compressing records as defined in claim 69, further comprising the step of:
associating an examine-child indicator with a SC in a child entry to indicate if the SC ends a dictionary string (and therefore detects an end of a record string) when the SC compares-equal with a current record character without requiring an access of any other dictionary entry.

74. A method of compressing records as defined in claim 73, further comprising the steps of:
setting the examine-child indicator associated with a SC to indicate no access of the associated child entry (child) is required when it has been predetermined that the child has no assigned ECs other than the designating SC and has in turn no child of its own since this indicates no further possible continuation of the matching process; or
setting the examine-child indicator to indicate an access of the child is required when it has been predetermined that the child has assigned ECs other than the designating SC or has children of its own since then it is not known either that there is truly a match on the child or that no continuation of the matching process is possible.

75. A method of compressing records as defined in claim 68, further comprising the steps of:
placing in a child list under a parent entry (parent) containing a more-children indicator an entry that is not an alphabetic entry or a non-alphabetic entry but is called a sibling descriptor (SD) containing CCs associated with child entries (children) of the same parent whose respective identifying CCs cannot be contained in the space available in the parent, these CCs being called sibling characters (SCs) to distinguish them from the CCs in the parent, with it predetermined or indicated in the SD that each SC is either the first EC assigned to an associated child entry (child) of the same parent or is a set of the first ECs assigned to an associated child of the same parent, so that the SCs can increase the efficiency of detecting record strings in the dictionary by enabling detection of an end of a record string without additional accesses to the child dictionary entries assigned to the SCs;
placing a count indicator in the SD indicating the number of SCs contained in the SD; and
assigning each SC in the SD to be associated with a respective child entry in the child list.

76. A method of compressing records as defined in claim 75, further comprising the step of:
locating a SD in a predetermined way relative to the location of the child entry designated by the last CC contained within the parent.

77. A method of compressing records as defined in claim 76, further comprising the step of:
calculating a location of a child entry from the location of a SD containing SCs and the location of an associated SC in the SD comparing-equal with a next record character to be matched against an EC in the dictionary string for generating an index symbol for a record string being currently detected.

78. A method of compressing records as defined in claim 76, further comprising the steps of:
setting-on a more-siblings indicator in a control field of a SD to indicate that the SD has more SCs than are contained within the SD; and
placing another SD containing those additional SCs in a predetermined location relative to the location of the child entry designated by the last SC in the first SD.

79. A method of compressing records as defined in claim 75, further comprising the step of:
associating an examine-child indicator with a SC in SD to indicate if the SC ends a dictionary string (and therefore detects an end of a record string) when the SC compares-equal with a current record character without requiring an access of any other dictionary entry.

80. A method of compressing records as defined in claim 79, further comprising the steps of:
setting the examine-child indicator associated with a SC to indicate no access of the associated child entry (child) is required when it has been predetermined that the child has no assigned ECs other than the designating SC and has in turn no child of its own since this indicates no further possible continuation of the matching process; or
setting the examine-child indicator to indicate an access of the child is required when it has been predetermined that the child has assigned ECs other than the designating SC or has children of its own since then it is not known either that there is truly a match on the child or that no continuation of the matching process is possible.

81. A method of compressing records as defined in claim 63, further comprising the step of:
associating an examine-child indicator with a CC in a parent entry to indicate if the CC ends a dictionary string (and therefore detects an end of a record string) when the CC compares-equal with a current record character without requiring an access of any other dictionary entry.

82. A method of compressing records as defined in claim 81, further comprising the steps of:
setting the examine-child indicator associated with a CC to indicate no access of the associated child entry (child) is required when it has been predetermined that the child has no assigned ECs other than the designating CC and has in turn no child of its own since this indicates no further possible continuation of the matching process; or setting the examine-child indicator to indicate an access of the child is required when it has been predetermined that the child has assigned ECs other than the designating CC or has children of its own since then it is not known either that there is truly a match on the child or that no continuation of the matching process is possible.

83. A method of using the process defined in claim 54, further comprising the step of:

detecting a record string when all ECs in a dictionary entry compare-equal with record characters when an ending indication in the dictionary entry indicates the entry ends a dictionary string.

84. A method of expanding compressed records as defined in claim 54, further comprising the step of:

using the static dictionary to expand compressed records obtained from the data base in random order even though the static dictionary was pregenerated by scanning the data base in any order (the same random order, a different random order, or a sequential order) in order to compress and expand records in a way that cannot be done by using an adaptive dictionary.

85. A method of expanding compressed records as defined in claim 54, further comprising the step of:

using the static dictionary to expand compressed records obtained from the data base in random order even though the compressed records were generated by compressing uncompressed records obtained from the data base in any order (the same random order, a different random order, or a sequential order) in order to compress and expand records in a way that cannot be done by using an adaptive dictionary.

86. A method of using the process defined in claim 54, further comprising the steps of:

providing one or more predecessor dictionary entries in the dictionary chained to the entry located with an index symbol, when more ancestor ECs (ECs assigned to ancestors of the located entry) exist in the associated dictionary string than are contained within the entry located with an index symbol; and duplicating in the entry located with the index symbol one or more ancestor ECs represented by predecessor entry(s) to enable outputting of ancestor ECs in the string without accessing associated predecessor entry(s).

87. A method of using the process defined in claim 86, further comprising the step of:

duplicating in a predecessor entry one or more ancestor ECs of the predecessor entry in the string when the entry located with an index symbol cannot contain all ancestor ECs in the string to enable outputting of further ancestor ECs without accessing other predecessor entries.

88. A method of expanding compressed records as defined in claim 87, further comprising the step of:

providing a predecessor pointer field in each predecessor dictionary entry, except a first predecessor entry, in a chain of dictionary entries in the dictionary when a plurality of ancestor characters exist in the dictionary string.

89. A method of using the process defined in claim 54, further comprising the steps of:

structuring a symbol length field (SL) in a dictionary entry to indicate a total number of ECs in a dictionary string from the EC assigned to the entry to an EC that begins the string; and determining from the SL if space exists in an output buffer to receive characters to be outputted for a current record string.

90. A method of using the process defined in claim 89, further comprising the steps of:

outputting ECs for a record string located with an index symbol from chained dictionary entries accessed in their chained order, which is in inverse order to an EC sequence required in a corresponding uncompressed record;

recording in an output buffer the ECs outputted from the chain of accessed dictionary entries in an order that puts the ECs in an order required in the uncompressed record; and selecting ECs within each of the entries in a sequence required in the corresponding uncompressed record.

91. A method of using the process defined in claim 89, further comprising the step of:

indicating in the entry whether all of the ECs (ECs assigned to the entry and ancestor ECs) of an associated record string are contained in the entry in order to indicate no additional accesses of predecessor entry(s) are required to obtain all ECs in the string for the expansion process.

92. A method of expanding compressed records as defined in claim 91, further comprising the step of:

indicating in the entry the number of ECs (ECs assigned to the entry and ancestor ECs) to be taken from the entry and placed in the output buffer when it is already indicated in the entry that not all of the ECs of an associated record string are contained in the entry.

93. A method of expanding compressed records as defined in claim 54, further comprising the step of:

structuring an offset field in a dictionary entry to indicate the position relative to a current cursor position in an output buffer where the EC(s) assigned to the entry and ancestor EC(s) in the entry are to be placed such that when further ECs are then taken from ancestor entries the uncompressed record will have been produced beginning at the current cursor position in the output buffer.

94. A method of expanding compressed records as defined in claim 93, further comprising the steps of:

outputting ECs for a record string located with an index symbol from chained dictionary entries accessed in their chained order, which is in inverse order to an EC sequence required in a corresponding uncompressed record;

recording in an output buffer the ECs outputted from the chain of accessed dictionary entries in an order that puts the ECs in an order required in the uncompressed record; and selecting ECs within each of the entries in a sequence required in the corresponding uncompressed record.

95. A method of expanding compressed records as defined in claim 93, further comprising the step of:

indicating in the entry whether all of the ECs (ECs assigned to the entry and ancestor ECs) of an associated record string are contained in the entry in order to indicate no additional accesses of predecessor entry(s) are required to obtain all ECs in the string for the expansion process.

96. A method of expanding compressed records as defined in claim 95, further comprising the step of:

indicating in the entry the number of ECs (ECs assigned to the entry and ancestor ECs) to be taken from the entry and placed in the output buffer when it is already indicated in the entry that not all of the ECs of an associated record string are contained in the entry.

97. A method of compressing records as defined in claim 54, further comprising the steps of:

extending an index symbol with an indicator of whether the symbol is truly an index symbol designating a dictionary entry or whether the symbol contains a count of a following number of uncompressed characters that appear in their uncompressed form because they are not represented in the dictionary by a ZL string or strings sufficiently long to provide good compression when ZL compression is used; and processing during the expansion process an index symbol with this indicator by moving the number of uncompressed characters indicated by the count from the compressed record to the uncompressed record.

98. A method of compressing records as defined in claim 54, further comprising the steps of:

structuring the dictionary entries in a ZL dictionary string into alternating levels of two types with entries at the first type of level having one assigned EC and multiple (N) children and entries at the second type of level having one or multiple assigned ECs but not necessarily more than one child; and further structuring the entries at the second type of level such that the first child at that level has N assigned ECs, the next child has N-1 assigned ECs, the next child has N-2 assigned ECs, and so forth until the last child has one assigned EC, with the purpose of this structuring being to compress long strings of the same repeated character and of many different lengths by accessing fewer dictionary entries than would be required to be accessed if the structuring were not as defined here.

* * * * *